United States Patent
Hareyama et al.

(10) Patent No.: US 12,150,383 B2
(45) Date of Patent: Nov. 19, 2024

(54) THERMOELECTRIC POWER GENERATION MODULE AND METHOD OF MANUFACTURING THERMOELECTRIC POWER GENERATION MODULE

(71) Applicants: SONY GROUP CORPORATION, Tokyo (JP); SONY SEMICONDUCTOR SOLUTIONS CORPORATION, Kanagawa (JP)

(72) Inventors: Kosuke Hareyama, Kanagawa (JP); Christopher Wright, London (GB); Matthew Lawrenson, London (GB); Bernadette Elliott-Bowman, London (GB); Timothy Beard, London (GB)

(73) Assignees: SONY SEMICONDUCTOR SOLUTIONS CORPORATION, Kanagawa (JP); SONY GROUP CORPORATION, Tokyo (JP)

( * ) Notice: Subject to any disclaimer, the term of this patent is extended or adjusted under 35 U.S.C. 154(b) by 0 days.

(21) Appl. No.: 18/005,070

(22) PCT Filed: Jun. 8, 2021

(86) PCT No.: PCT/JP2021/021674
§ 371 (c)(1),
(2) Date: Jan. 11, 2023

(87) PCT Pub. No.: WO2022/018989
PCT Pub. Date: Jan. 27, 2022

(65) Prior Publication Data
US 2023/0263060 A1    Aug. 17, 2023

(30) Foreign Application Priority Data

Jul. 21, 2020   (JP) .................................. 2020-124480

(51) Int. Cl.
*H10N 10/17* (2023.01)
*H10N 10/01* (2023.01)

(52) U.S. Cl.
CPC ............. *H10N 10/17* (2023.02); *H10N 10/01* (2023.02)

(58) Field of Classification Search
CPC .............................. H10N 10/17; H10N 10/01
See application file for complete search history.

(56) References Cited

U.S. PATENT DOCUMENTS

| 10,292,307 | B1 | 5/2019 | Wyland |
| 2013/0180563 | A1 | 7/2013 | Makansi |
| 2018/0209750 | A1 | 7/2018 | Im |

FOREIGN PATENT DOCUMENTS

| JP | 2008-198928 A | 8/2008 |
| JP | 2011-204930 A | 10/2011 |

(Continued)

OTHER PUBLICATIONS

Kimura et al., JP 2013110867 A, English Machine Translation. (Year: 2013).*

(Continued)

*Primary Examiner* — Tae-Sik Kang
(74) *Attorney, Agent, or Firm* — CHIP LAW GROUP

(57) ABSTRACT

Provided is a thermoelectric power generation module that includes a heat-dissipating body that dissipates heat generated by a heat-generating body, a thermoelectric power generation element disposed at an approximately central section of a top surface of the heat-dissipating body, and a thermally-responsive body that is disposed on an outer peripheral section of the top surface of the heat-dissipating body and whose thermal resistance changes according to temperature. The thermoelectric power generation element and the thermally-responsive body are disposed on a bottom surface of the heat-generating body, and the thermally- (Continued)

responsive body is formed such that the thermal resistance of the thermally-responsive body becomes larger than that for the thermoelectric power generation element when the heat-generating body has a low temperature and that the thermal resistance of the thermally-responsive body becomes equal to or smaller than that for the thermoelectric power generation element when the heat-generating body has a high temperature.

6 Claims, 16 Drawing Sheets

(56) References Cited

FOREIGN PATENT DOCUMENTS

| JP | 2012-089633 A | | 5/2012 |
|---|---|---|---|
| JP | 2013-062299 A | | 4/2013 |
| JP | 2013-096819 A | | 5/2013 |
| JP | 2013110867 A | * | 6/2013 |
| JP | 2018-133460 A | | 8/2018 |

OTHER PUBLICATIONS

International Search Report and Written Opinion of PCT Application No. PCT/JP2021/021674, issued on Aug. 31, 2021, 08 pages of ISRWO.

* cited by examiner

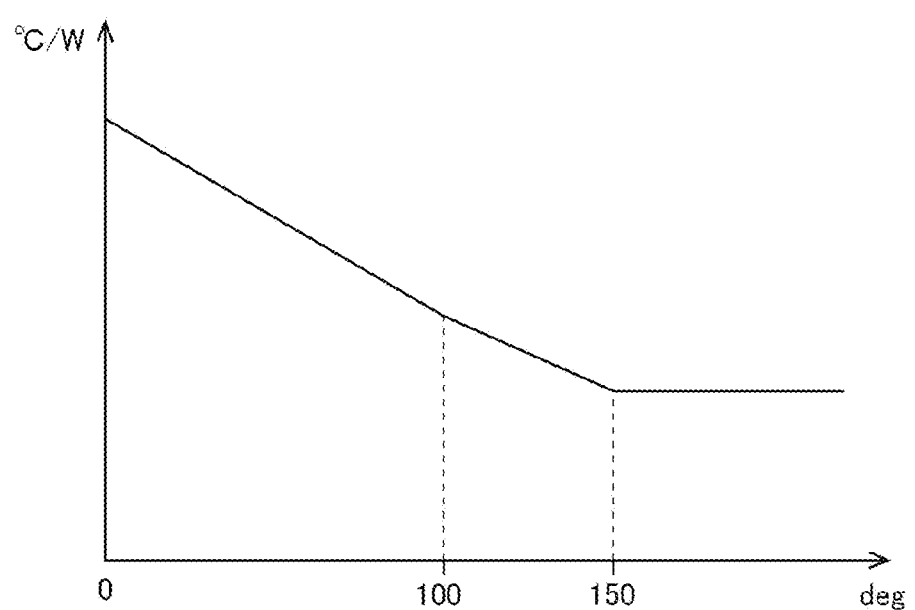

THERMOELECTRIC POWER GENERATION MODULE AND METHOD OF MANUFACTURING THERMOELECTRIC POWER GENERATION MODULE

CROSS REFERENCE TO RELATED APPLICATIONS

This application is a U.S. National Phase of International Patent Application No. PCT/JP2021/021674 filed on Jun. 8, 2021, which claims priority benefit of Japanese Patent Application No. JP 2020-124480 filed in the Japan Patent Office on Jul. 21, 2020. Each of the above-referenced applications is hereby incorporated herein by reference in its entirety.

TECHNICAL FIELD

The present disclosure pertains to a thermoelectric power generation module and a method of manufacturing a thermoelectric power generation module. In more detail, the present disclosure pertains to a thermoelectric power generation module that converts thermal energy, which is generated by a heat-generating body in conjunction with power consumption, into electrical energy, and a method of manufacturing the thermoelectric power generation module.

BACKGROUND ART

In the past, due to heat generation in conjunction with power consumption, a semiconductor component has been forcibly cooled by mounting a heat sink to the semiconductor component and performing cooling that uses a heat dissipation action by the heat sink, or by disposing a small fan and blowing air. In other words, heat generated by a semiconductor component due to power consumption is wasted by being dissipated into the air in such a manner.

Accordingly, in recent years, there has been progress in consideration for using a thermoelectric power generation element (Thermo-electric generator: referred to as a "TEG") to reuse heat by converting the heat to electricity.

PTL 1 discloses a technique pertaining to a ceramic package having superior heat dissipation. Specifically, there is disclosed a configuration for a ceramic package having a flat plate-shaped substrate body that has a front surface and a back surface and a front surface side frame disposed on the front surface side along the outer peripheral shape of the substrate body, in which multiple thermoelectric conversion elements are disposed on the back surface of the substrate body, which is ceramic, across first electrodes and are connected in series, and a heat transfer member on which a heat-generating element is mounted is disposed on the front surface of the substrate body at a position facing the multiple thermoelectric conversion elements. With such a configuration, electric power is supplied to the thermoelectric conversion elements which are connected in series, whereby a thermoelectric power generation element that can efficiently absorb heat generated by the heat-generating element is used.

PTL 2 discloses a cooling structure that uses a semiconductor substrate driven as a Peltier element or a Seebeck element, and an electronic device that incorporates this structure. Specifically, the cooling structure has multiple semiconductor substrates that are disposed approximately parallel and face each other in one direction with gaps therebetween, a securing substrate for securing these to be approximately vertical, and a filler that has an electrical insulation property and thermal conductivity and that is filled in gaps at a secured section side for the semiconductor substrates such that the semiconductor substrates and the securing substrate are caused to be integral. The configuration is such that the securing substrate is mounted on a surface of a heat source section and that the heat source section is cooled. The semiconductor substrates are configured such that p-type Si substrates and n-type Si substrates, which are alternatingly disposed in one direction and connected in series, are driven as Peltier elements or Seebeck elements.

By achieving such a configuration, a cooling structure in which heat from the heat source section is transmitted to the semiconductor substrates and dissipated is achieved.

CITATION LIST

Patent Literature

[PTL 1]
Japanese Patent Laid-open No. 2018-133460
[PTL 2]
Japanese Patent Laid-open No. 2008-198928

SUMMARY

Technical Problem

However, the technique pertaining to the ceramic package disclosed in PTL 1 performs cooling by using a thermoelectric conversion element to absorb heat generated by a heat-generating element. The thermoelectric conversion element used in this technique at present has a problem that a thermoelectric conversion rate decreases in a case where a temperature gradient with respect to a heat-dissipating body such as a heat sink is low.

The technique pertaining to the cooling structure disclosed in PTL 2 uses a thermoelectric conversion element to perform thermoelectric power generation using heat generated by a heat-generating element. As described above, a thermoelectric conversion element used in this technique also at present has the problem that a thermoelectric conversion rate decreases in a case where a temperature gradient between a heat source section and a heat-dissipating body, such as a semiconductor substrate, used as a thermoelectric element is low.

The present disclosure is made in the light of the problems described above and, for example, has an objective of providing a thermoelectric power generation module that can be used for heat dissipation by a semiconductor component, that uses a thermoelectric power generation element, and that has improved thermoelectric power generation efficiency.

Solution to Problem

The present disclosure is made in order to solve the problems described above, and a first aspect thereof is a thermoelectric power generation module provided with a heat-dissipating body that dissipates heat generated by a heat-generating body, a thermoelectric power generation element disposed at an approximately central section of a top surface of the heat-dissipating body, and a thermally-responsive body that is disposed on an outer peripheral section of the top surface of the heat-dissipating body and whose thermal resistance changes according to temperature, the heat-generating body being disposed on top surfaces of the thermoelectric power generation element and the thermally-responsive body.

In addition, in this first aspect, the thermally-responsive body may be formed such that the thermal resistance of the thermally-responsive body becomes larger than a thermal resistance of the thermoelectric power generation element when the heat-generating body has a low temperature and that the thermal resistance of the thermally-responsive body becomes equal to or smaller than the thermal resistance of the thermoelectric power generation element when the heat-generating body has a high temperature.

In addition, in this first aspect, the thermally-responsive body may have a granular heat conductor disposed within a cavity provided at an outer peripheral section of the thermoelectric power generation element, and a thermally-responsive member that has a high coefficient of linear expansion and is poured leaving a predetermined space within the cavity, and the thermally-responsive member may be configured to, when the heat-generating body has a low temperature, retain the predetermined space and, when the heat-generating body has a high temperature, expand and cause the predetermined space to shrink, reducing the thermal resistance of the thermally-responsive member by the heat-generating body being thermally connected to the heat-dissipating body via the heat conductor and the thermally-responsive member.

In addition, in this first aspect, the thermally-responsive body may have thin plate-shaped heat conductors stacked within a cavity provided at an outer peripheral section of the thermoelectric power generation element, and a thermally-responsive member that has a high coefficient of linear expansion and is poured leaving a predetermined space within the cavity, and the thermally-responsive member may be configured to, when the heat-generating body has a low temperature, retain the predetermined space and, when the heat-generating body has a high temperature, expand and cause the predetermined space to shrink, reducing the thermal resistance of the thermally-responsive member by the heat-generating body being thermally connected to the heat-dissipating body via the heat conductor and the thermally-responsive member.

In addition, in this first aspect, the thermally-responsive body may have a heat conductor that includes a double layer structure having a high coefficient-of-linear-expansion material and a low coefficient-of-linear-expansion material that are disposed in an inclined manner within a cavity provided at an outer peripheral section of the thermoelectric power generation element, and a thermally-responsive member that has a high coefficient of linear expansion and is poured leaving a predetermined space within the cavity, and the thermally-responsive member may be configured to, when the heat-generating body has a low temperature, retain a state in which disposition is in the inclined manner and, when the heat-generating body has a high temperature, expand such that the heat conductor bends and stands upright, changing the thermal resistance of the thermally-responsive member by the heat-generating body being thermally connected to the heat-dissipating body via the thermally-responsive member and the heat conductor that includes the double layer structure.

In addition, in this first aspect, the thermoelectric power generation element having a protrusion may be disposed within a cavity provided on the top surface of the heat-dissipating body, and the thermally-responsive body may include the granular heat conductor disposed within a space provided at an outer peripheral section of the protrusion, the thin plate-shaped heat conductor stacked within the space provided at the outer peripheral section of the protrusion, or a heat conductor that includes a double layer structure having the high coefficient-of-linear-expansion material and a low coefficient-of-linear-expansion material and is disposed in an inclined manner within the space provided at the outer peripheral section of the protrusion, and a thermally-responsive member that has a high coefficient of linear expansion and is poured leaving a predetermined space, and the thermally-responsive member and the heat conductor may be configured such that, when the heat-generating body has a low temperature, the predetermined space or state is retained and, when the heat-generating body has a high temperature, the thermally-responsive member expands to cause the predetermined space to shrink or bend the heat conductor to have the heat conductor stand upright, changing the thermal resistance of the thermally-responsive member by the heat-generating body being thermally connected to the heat-dissipating body via the heat conductor and the thermally-responsive member.

In addition, in this first aspect, the predetermined space may be formed at an upper end of a peripheral side surface of the cavity provided at the outer peripheral section of the thermoelectric power generation element.

In addition, in this first aspect, the thermoelectric power generation element disposed within the cavity may be formed in an inclined shape having a predetermined thickness at an approximately central section of the top surface of the heat-dissipating body and becoming thinner from near the approximately central section toward a periphery of the outer peripheral section.

In addition, in this second aspect, provided is a method of manufacturing a thermoelectric power generation module, the method including a step of mounting the thermoelectric power generation element to a heat-dissipating body, a step of disposing a member for surrounding the thermally-responsive body at an outer peripheral section of the thermoelectric power generation element mounted at the approximately central section, a step of using the member for surrounding the thermally-responsive body disposed at the outer peripheral section, to mount the thermally-responsive body to a formed cavity, a step of adhering a thermal interface material having high thermal conductivity, to top surfaces of the thermoelectric power generation element and the thermally-responsive body, and a step of adhering a heat-generating body to a top surface of the thermal interface material.

In addition, in this third aspect, provided is a method of manufacturing a thermoelectric power generation module, the method including a step of making, at an approximately central section of a heat-dissipating body, a cavity that has a predetermined depth and is for mounting the thermoelectric power generation element and the thermally-responsive body, a step of mounting a thermoelectric power generation element into the cavity that has been made, a step of mounting the thermally-responsive body in the cavity, a step of adhering a thermal interface material having high thermal conductivity, to top surfaces of the thermoelectric power generation element and the thermally-responsive body, and a step of adhering a heat-generating body to a top surface of the thermal interface material.

By employing the aspects described above, at a time of low temperature, for the thermally-responsive body in the thermoelectric power generation module, the thermal resistance thereof becomes larger than that of the thermoelectric power generation element, and thus the thermoelectric power generation element efficiently performs thermoelectric power generation while also conveying heat from the heat-generating body to the heat-dissipating body to thereby dissipate the heat. In contrast, at a time of high temperature, the thermal resistance of the thermally-responsive body becomes equal to or less than that of the thermoelectric power generation element, and thus achieves an effect of the thermoelectric power generation element efficiently performing thermoelectric power generation while the thermally-responsive body and the thermoelectric power generation element convey heat from the heat-generating body to the heat-dissipating body to thereby dissipate the heat.

By virtue of the present disclosure, such an effect as suppressing a rise in temperature due to heat generated by a semiconductor component, etc., that is a heat-generating body, while also improving thermoelectric power generation efficiency is achieved.

BRIEF DESCRIPTION OF DRAWINGS

FIG. 19 is a view that illustrates another example of a relation between a temperature difference and thermal resistance for the thermoelectric power generation module according to the fourth embodiment of the present disclosure.

DESCRIPTION OF EMBODIMENTS

Next, with reference to the drawings, description is given regarding modes (referred to below as embodiments) for implementing the present technology. In the following drawings, the same or similar portions are denoted by the same or similar reference signs. However, the drawings are schematic, and dimensional ratios, etc., for respective sections do not necessarily match those for real objects. In addition, it goes without saying that portions where dimensional relations and ratios are mutually different between the drawings are included. Specific embodiments will be described in the following order after describing a basic configuration and operation for a thermoelectric power generation module according to the present technique.

1. First Embodiment
2. Second Embodiment
3. Third Embodiment
4. Fourth Embodiment
5. First embodiment of manufacturing method
6. Second embodiment of manufacturing method
7. Example of application to semiconductor component <Basic Configuration and Operation of Thermoelectric Power Generation Module>

Figure 1:
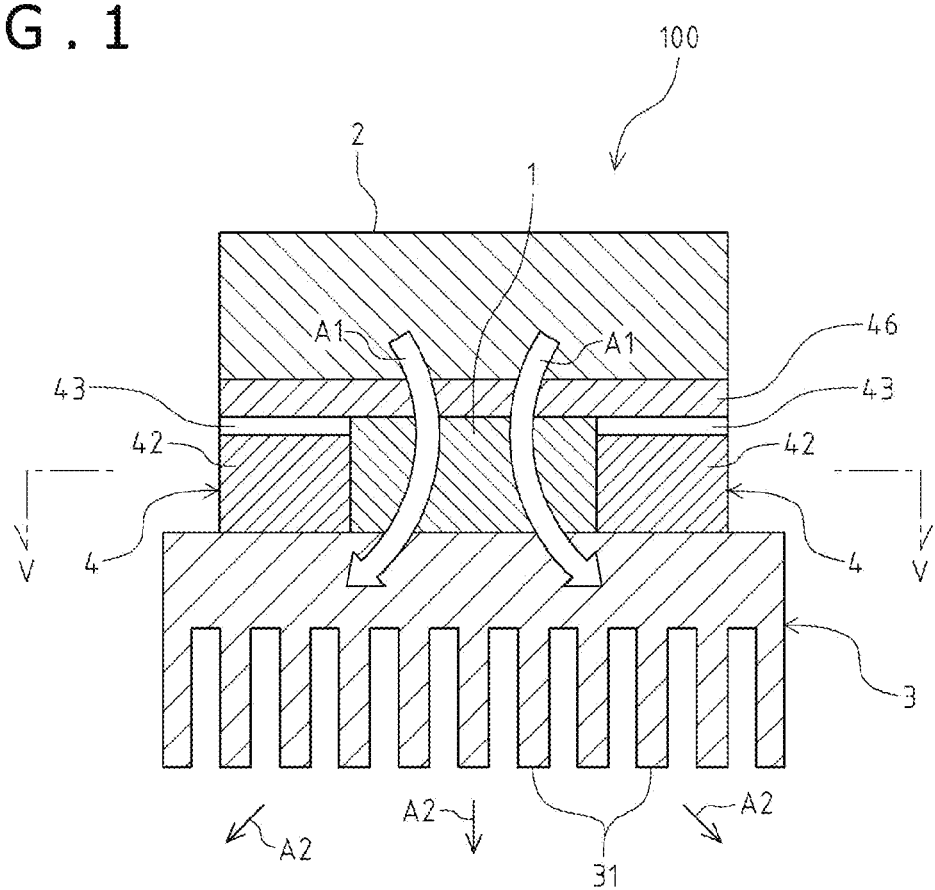
FIG. 1 is a view that illustrates an example of a basic configuration of a thermoelectric power generation module according to an embodiment of the present disclosure, and operation for a low temperature difference.
Figure 2:
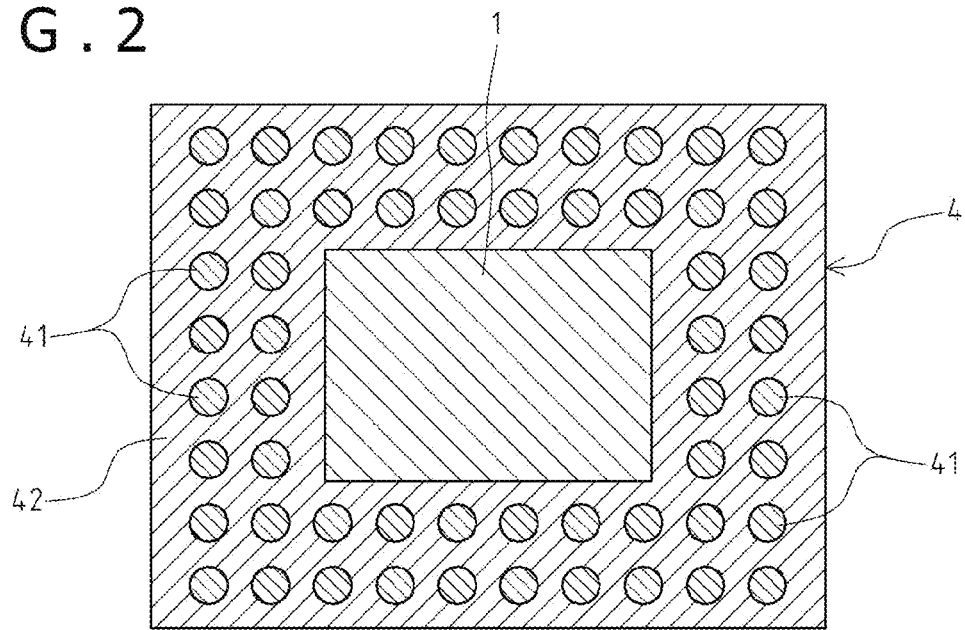
FIG. 2 is an end surface view taken along a line V-V in FIG. 1.
Figure 3:
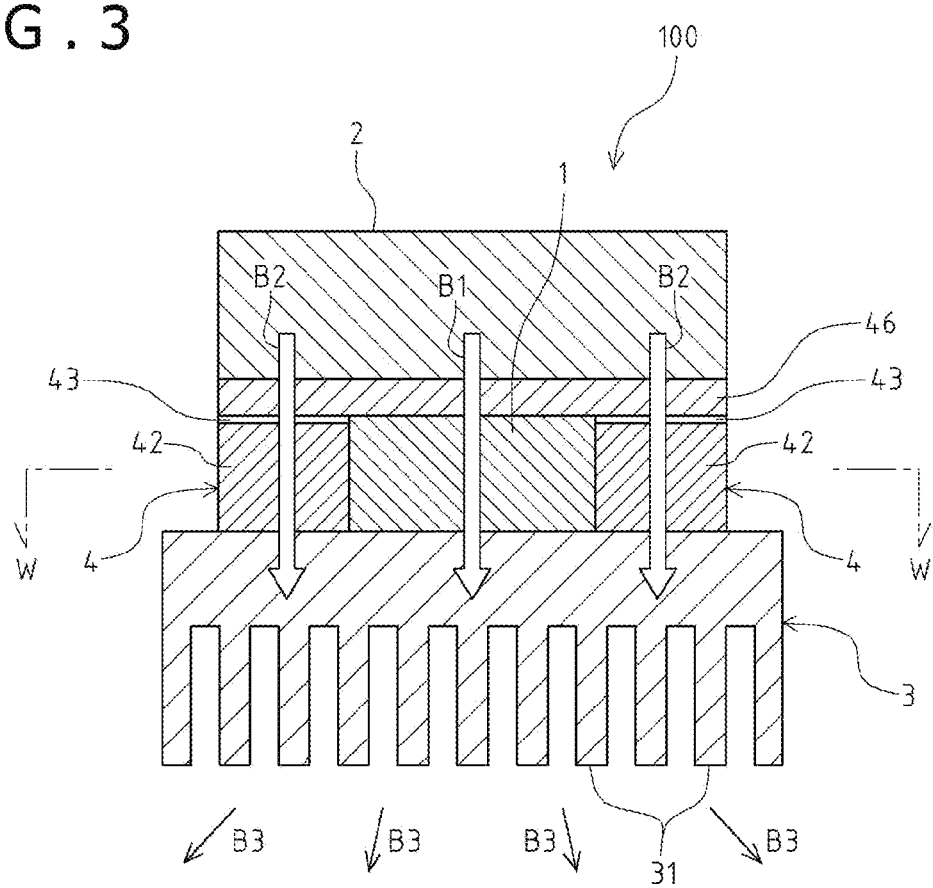
FIG. 3 is a view that illustrates an example of a basic configuration of a thermoelectric power generation module according to an embodiment of the present disclosure, and operation for a high temperature difference.
Figure 4:
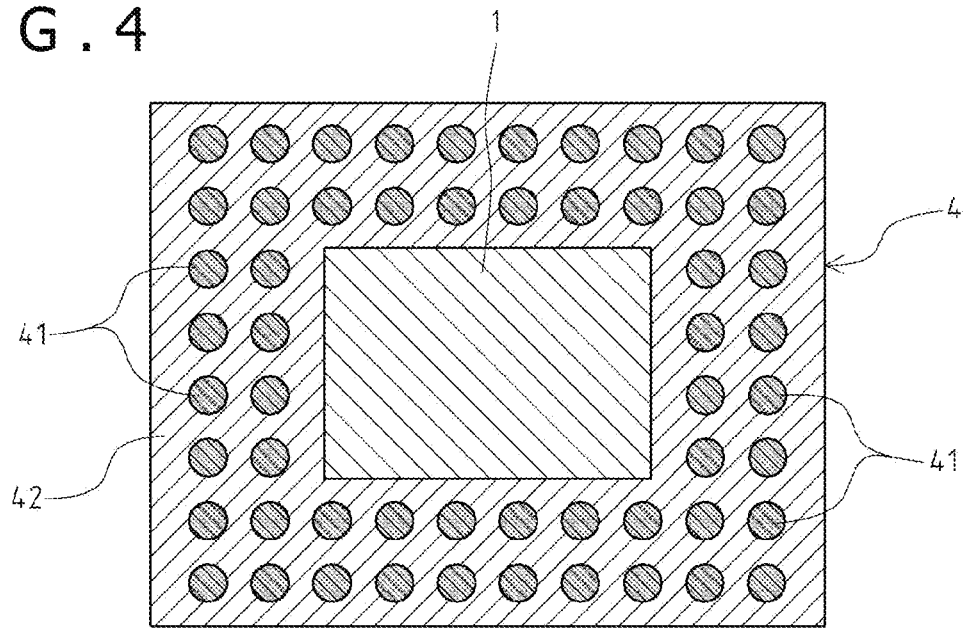
FIG. 4 is an end surface view taken along a line W-W in FIG. 3.

FIGS. 1 and 2 are views that illustrate an example of a basic configuration of a thermoelectric power generation module 100 according to an embodiment of the present disclosure, and operation for a low temperature difference. In addition, FIGS. 3 and 4 are views that illustrate operation for a high temperature difference for the same. Firstly, description is given regarding an example of the basic configuration of the thermoelectric power generation module 100 according to an embodiment of the present disclosure, operation for a low temperature difference, and operation for a high temperature difference.

[Configuration of Thermoelectric Power Generation Module]

The thermoelectric power generation module 100 is provided with a heat-dissipating body 3 that dissipates heat generated by a heat-generating body 2, a thermoelectric power generation element 1 disposed at an approximately central section of a top surface of the heat-dissipating body 3, and a thermally-responsive body 4 that is disposed on an outer peripheral section of the top surface of the heat-dissipating body 3 and whose thermal resistance changes according to temperature, the thermoelectric power generation element 1 including the thermally-responsive body 4, the heat-generating body 2 being disposed on top surfaces of the thermoelectric power generation element 1 and the thermally-responsive body 4.

Specifically, the thermoelectric power generation element 1, which has an approximately rectangular shape having a predetermined thickness, is disposed at the approximately central section of the top surface of the heat-dissipating body 3 as illustrated in the side-surface cross section in FIG. 1 and the cross-sectional view taken along arrows V-V in FIG. 2. Further, the thermally-responsive body 4, which has substantially the same thickness as that of the thermoelectric power generation element 1 is disposed at the outer peripheral section of the top surface of the heat-dissipating body 3. In addition, the top surfaces of the thermoelectric power generation element 1 and the thermally-responsive body 4 are covered by and adhered to a thermal interface material (referred to as a "TIM material") 46, which is an electrical insulator and has high thermal conductivity, and the heat-generating body 2 is disposed on the top surface thereof. It is possible to reduce thermal resistance by filling the thermal interface material 46, which has low thermal resistance, into a gap in a joining surface between the heat-generating body 2 and the thermoelectric power generation element 1 as well as the thermally-responsive body 4.

The thermoelectric power generation element 1 joins two types of different metals or semiconductors, causes one of these to come into contact with the heat-generating body 2 on a high-temperature side, causes the other to come into contact with the heat-dissipating body 3 on a low-temperature side, and uses an electromotive force arising due to a temperature difference at a joint section, to perform power generation (thermoelectric power generation).

There is known a phenomenon in which, when two types of different metals or semiconductors are joined and a temperature difference is caused to arise at both ends of a joint section therefor, an electromotive force arises. Such a phenomenon is referred to as a Seebeck effect. In order to obtain a large difference in potential, a p-type thermal semiconductor and an n-type thermal semiconductor are combined and used. The thermoelectric power generation element 1 in the present disclosure uses the Seebeck effect to perform power generation.

Figure 23:
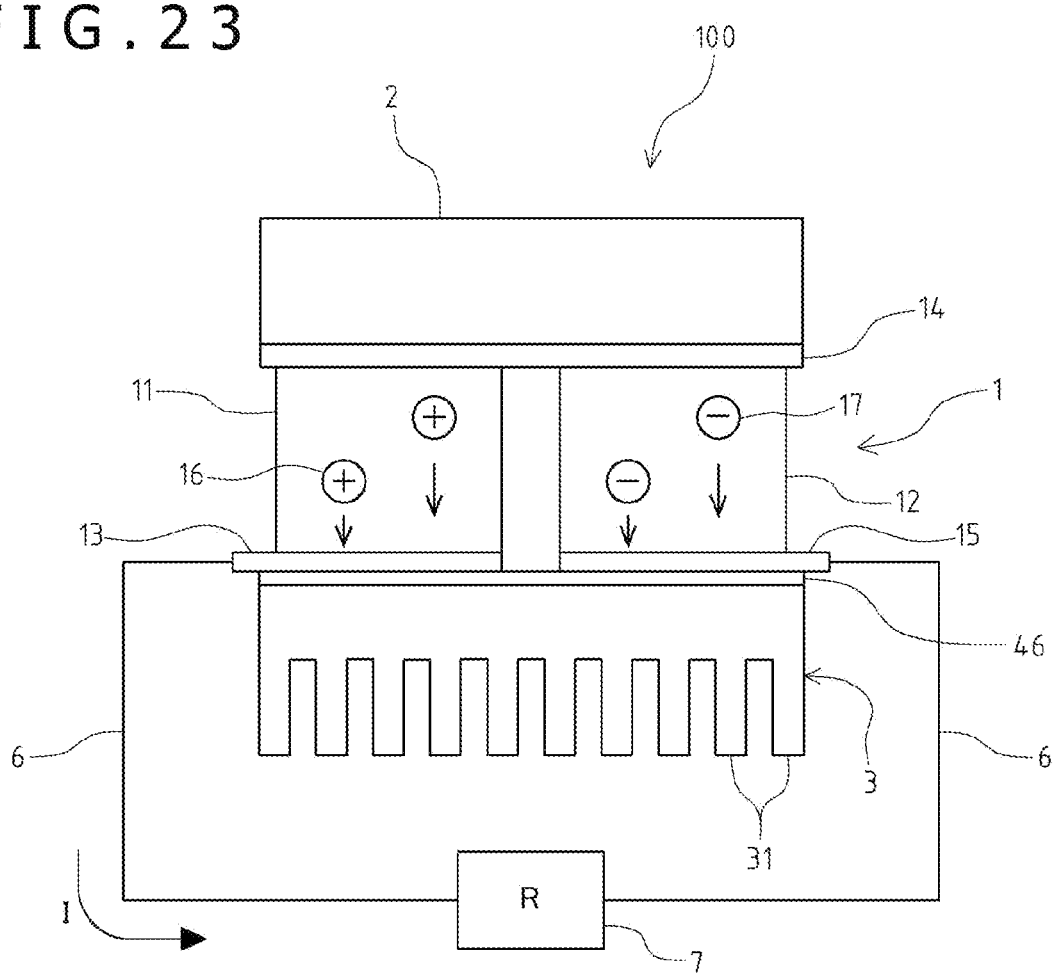
FIG. 23 is a schematic circuit diagram for thermoelectric power generation using a thermoelectric power generation element.

FIG. 23 illustrates a schematic circuit diagram for thermoelectric power generation using the thermoelectric power generation element 1. In this figure, the thermoelectric power generation element 1 is connected in series to a positive electrode 13, a p-type thermoelectric semiconductor 11, a conductor 14, an n-type thermoelectric semiconductor 12, and a negative electrode 15 in this order. Further, the conductor 14 is adhered to the heat-generating body 2, and the positive electrode 13 and the negative electrode 15 are adhered to the heat-dissipating body 3 across the thermal interface material 46 which is an electrical insulator and which has high thermal conductivity. The heat-dissipating body 3 is a heat sink formed from aluminum, for example. In addition, for the p-type thermoelectric semiconductor 11 and the n-type thermoelectric semiconductor 12, typically, a bismuth tellurium (Bi2Te3) semiconductor is used.

In the schematic circuit diagram illustrated in FIG. 23, the heat-generating body 2 generates heat, whereby a temperature difference arises between the heat-generating body 2 and the heat-dissipating body 3. Accordingly, in the p-type thermoelectric semiconductor 11, holes 16 excited on the high-temperature side move from the high-temperature side to the low-temperature side, in other words, in a direction from the heat-generating body 2 to the heat-dissipating body 3. In addition, in the n-type thermoelectric semiconductor 12, electrons 17 excited on the high-temperature side move from the high-temperature side to the low-temperature side, in other words, in a direction from the heat-generating body 2 to the heat-dissipating body 3.

Accordingly, a positive (+) charge occurs on the positive electrode 13 side and a negative (−) charge occurs on the negative electrode 15 side. Then, when the positive electrode 13 and the negative electrode 15 are connected to a load (R) 7 via leads 6, a current I flows. As a result, it is possible to extract, from the load 7, electrical energy from electric power (P: unit W) as illustrated in formula (1). The above is a principle for thermoelectric power generation.

[Math. 1]

$$P=RI^2(W) \tag{1}$$

Electrical connections for the thermoelectric power generation element 1 in the present technique are as illustrated in FIG. 23. However, a technique according to the present disclosure pertains to heat and temperature, and thus a description of examples below omits detailed description pertaining to electrical connections in order to avoid complications.

Figure 24:
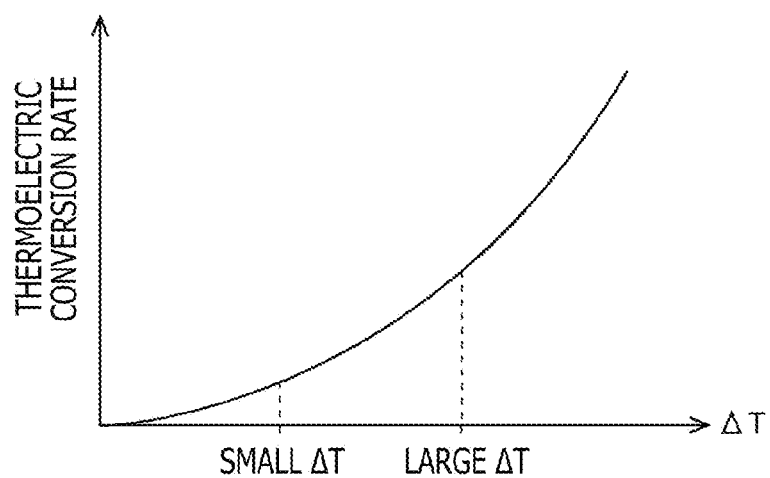
FIG. 24 is a view for describing a thermoelectric conversion rate for the thermoelectric power generation element.

As illustrated in FIG. 24, the thermoelectric power generation element 1 is capable of an efficient thermoelectric conversion in a case where there is a large temperature gradient between the heat-generating body 2 and the heat-dissipating body 3 which is a heat sink, etc. However, in a case where the temperature gradient is small, a thermoelectric conversion rate is low, and thus it is not possible to supply a large amount of electric power. Note that, in this figure, the horizontal axis is the temperature gradient between the heat-generating body 2 and the heat-dissipating body 3, and the vertical axis is the thermoelectric conversion rate.

The heat-generating body 2 is a heat source. As the heat-generating body 2, for example, there is a semiconductor component that is mounted to a printed substrate. Regarding heat generated by the semiconductor component, the larger the amount of heat generated, the greater the power consumption. In addition, typically, the larger the amount of heat generated, the faster an operating speed for the component. Regarding heat generated by such a heat-generating body 2, as illustrated in FIG. 1, heat flux is concentrated in the thermoelectric power generation element 1, which has low thermal resistance, is conveyed to the heat-dissipating body 3 (refer to arrows A1), and is dissipated into the atmosphere from the heat-dissipating body 3 (refer to arrows A2).

The heat-dissipating body 3 dissipates heat, which is from the heat-generating body 2 via the thermoelectric power generation element 1 and the thermally-responsive body 4, into the atmosphere to thereby suppress a rise in temperature of the heat-generating body 2. The heat-dissipating body 3 is a heat sink formed from aluminum, for example. For the heat sink, fins 31 are provided as illustrated in FIG. 1 in order to reduce thermal resistance with respect to the atmosphere and to increase a heat dissipation effect. Note that, although there are cases in the following description in which depiction of the fins 31 is omitted from the drawings, but this does not mean that the fins 31 are unnecessary.

In addition, the heat-dissipating body 3 can also use a fan for heat dissipation in addition to a heat sink. Moreover, the heat-dissipating body 3 is not limited to an air-cooled cooler, and includes a liquid-cooled cooler or a cooler that uses a Peltier effect.

Heat generated by the heat-generating body 2 is, for example, dissipated into the atmosphere by the heat-dissipating body 3. As a result, a rise in temperature of the heat-generating body 2 can be constrained. For example, in the case where a semiconductor component is the heat-generating body 2, when a comparison is made between the surface temperature of the semiconductor component and the temperature of the surface of the heat-dissipating body 3 which surface is in contact with the atmosphere, the surface temperature of the semiconductor component which is the heat-generating body 2 is greater than the temperature of the surface of the heat-dissipating body 3 which surface is in contact with the atmosphere.

Accordingly, heat generated by the heat-generating body 2 is conveyed to the heat-dissipating body 3 via the thermal interface material 46 and the thermoelectric power generation element 1, and dissipated into the atmosphere from the heat-dissipating body 3.

One surface of the thermoelectric power generation element 1 is in contact with the heat-generating body 2 via the thermal interface material 46, and the other surface is in contact with the heat-dissipating body 3. Accordingly, letting the temperature of the surface in contact with the heat-generating body 2 be t1 and the temperature of the surface in contact with the heat-dissipating body 3 be t2, a relation t1>t2 is established. In other words, a temperature difference $\Delta T = t1 - t2$ occurs in the thermoelectric power generation element 1 between the surface in contact with the heat-generating body 2 and the surface in contact with the heat-dissipating body 3. The temperature difference $\Delta T = t1 - t2$ arises at the joint section, whereby the thermoelectric power generation element 1 performs thermoelectric power generation.

As illustrated in FIGS. 1 and 2, the thermally-responsive body 4 is disposed at the outer peripheral section of the thermoelectric power generation element 1, which is disposed at the approximately central section of the top surface of the heat-dissipating body 3.

As illustrated in FIG. 2, the thermally-responsive body 4 is formed by pouring a thermally-responsive member 42 onto heat conductors 41 disposed at the outer peripheral section of the thermoelectric power generation element 1. Selected for the thermally-responsive member 42 are a structure and material that have good thermal conductivity and cause thermal resistance of a corresponding section to change due to bending, expansion, contraction, folding, or other mechanical changes within a temperature difference between the heat-generating body 2 and the heat-dissipating body 3. For example, it is a liquid material having a high coefficient of linear expansion (for example, 50 ppm/° C. or more), such as an epoxy resin. The heat conductors 41 are solid substances, such as carbon nanotubes, metal granules, or metal thin plates, which have high thermal conductivity (for example, 3000 to 5500 W/m·K).

In addition, a vacancy 43 is provided between the top surface of the thermally-responsive body 4 and the heat-generating body 2. The vacancy 43 is residual air and can be set to an appropriate volume by adjustment of a pouring amount for the thermally-responsive member 42. By interposing the vacancy 43, the thermal resistance for the thermally-responsive body 4 in the direction from the heat-generating body 2 to the heat-dissipating body 3 is formed to be greater than the thermal resistance for the thermoelectric power generation element 1.

In other words, the thermally-responsive body 4 is something whose thermal resistance changes due to the volume of the vacancy 43 changing according to temperature. Specifically, when the temperature is low, the volume of the vacancy 43 is large because the thermally-responsive member 42 has not expanded, and thus the thermal resistance gets large.

In contrast, there is the temperature characteristic in that, when the temperature increases, the thermally-responsive member 42 expands, the vacancy 43 is compressed, and because the volume thereof shrinks, the heat-generating body 2 and the heat-dissipating body 3 thermally connect to each other, whereby the thermal resistance decreases.

Since the thermally-responsive body 4 is configured as above, the thermal resistance for the thermally-responsive body 4 becomes greater than that of the thermoelectric power generation element 1 in a case of low temperatures. In addition, in a case of high temperatures, the thermal resistance can decrease to be approximately the same as or less than that of the thermoelectric power generation element 1.

[Operation by Thermoelectric Power Generation Module at Time of Low Heat Generation]

Description is given below regarding, in a case where an ambient temperature is constant, operation performed in a case where the heat-generating body 2 is at a time of low heat generation and in a case where the heat-generating body 2 is at a time of high heat generation. Firstly, the thermoelectric power generation module 100 according to the present disclosure operates as follows at a time of low heat generation. When the heat-generating body 2, which is a semiconductor component, etc., is subject to an energizing operation, the semiconductor component generates heat. In a case where, hypothetically, the thermoelectric power generation element 1 and the thermally-responsive body 4 have the same thermal conductivity, the generated heat is conveyed to the heat-dissipating body 3 via the thermoelectric power generation element 1 and the thermally-responsive body 4. The heat-dissipating body 3 dissipates the conveyed heat into the atmosphere from the surface of the heat-dissipating body 3. As a result, a rise in temperature of the heat-generating body 2 is suppressed.

Here, in a case where power consumption by a semiconductor component which is the heat-generating body 2 is low, the amount of heat generated by the heat-generating body 2 becomes low, and thus the temperature gradient between the heat-generating body 2 and the heat-dissipating body 3 also becomes small. Accordingly, the amount of power generated by the thermoelectric power generation element 1 also becomes small. Moreover, in such a case, the thermoelectric conversion rate for the thermoelectric power generation element 1 is low as illustrated in FIG. 24.

However, in a case where the amount of heat generated by the heat-generating body 2 is low, a rise in temperature for the thermally-responsive body 4 according to the present disclosure also becomes low. Accordingly, the thermal resistance for the thermally-responsive body 4 becomes larger than the thermal resistance for the thermoelectric power generation element 1. Accordingly, regarding heat generated by the heat-generating body 2, heat flux is concentrated in the thermoelectric power generation element 1, which has low thermal resistance, and is conveyed to the heat-dissipating body 3 as illustrated by the arrows A1 in FIG. 1.

Then, because the heat flux is concentrated in the thermoelectric power generation element 1 which has low thermal resistance, a temperature gradient between the heat-generating body 2 and the heat-dissipating body 3, which are in contact with the thermoelectric power generation element 1, becomes large. As a result, a thermoelectric power generation rate also increases, and the amount of power generated by the thermoelectric power generation element 1 also increases in proportion thereto.

Accordingly, at a time of low heat generation, it is possible to perform thermoelectric power generation in a region having a high thermoelectric power generation rate, and it is possible to ameliorate a reduction in the amount of power generated.

[Operation by Thermoelectric Power Generation Module at Time of High Heat Generation]

The thermoelectric power generation module 100 according to the present disclosure operates as follows at a time of high heat generation. The heat-generating body 2, which is a semiconductor component, etc., as described above, generates heat by being subject to an energizing operation.

Here, in a case of high power consumption by the semiconductor component which is the heat-generating body 2, the amount of heat generated by the heat-generating body 2 becomes large, and a rise in temperature of the heat-generating body 2 also becomes large. As a result, a temperature difference between the heat-generating body 2 and the heat-dissipating body 3, in other words, a temperature gradient, also becomes large. Accordingly, the amount of power generated by the thermoelectric power generation element 1 also becomes large. Moreover, in such a case, thermoelectric power generation is performed in a region where the thermoelectric conversion rate for the thermoelectric power generation element 1 is large as indicated in FIG. 24, and thus the amount of power generated also becomes large.

However, in a state where the temperature gradient between the heat-generating body 2 and the heat-dissipating body 3 remains large, a rise in temperature of the heat-generating body 2 also becomes large. Accordingly, for example, in a case where the heat-generating body 2 is a semiconductor component, there is a risk of inviting deterioration of the life of the semiconductor component while also giving rise to the occurrence of a failure or the occurrence of such a malfunction as a thermal runaway.

Accordingly, the thermally-responsive body 4 disposed at the outer peripheral section of the thermoelectric power generation element 1 operates as follows. The thermally-responsive member 42 included in the thermally-responsive body 4 is formed by a material having a high coefficient of linear expansion, as described above. Accordingly, when the temperature of the thermally-responsive member 42 rises, the thermally-responsive member 42 expands in proportion thereto.

As a result, as illustrated in FIG. 3, the vacancy 43 is compressed in conjunction with expansion of the thermally-responsive member 42, and the volume thereof shrinks. Accordingly, the space for the vacancy 43, which is formed between the heat-generating body 2 and the thermally-responsive body 4 is filled by the thermally-responsive body 4, and the heat-generating body 2 and the heat-dissipating body 3 are thermally connected to each other. In addition, because the thermally-responsive body 4 is formed from the heat conductors 41, which easily convey heat, and the thermally-responsive member 42, the thermal resistance of the thermally-responsive body 4 becomes small. Accordingly, heat flux is shared by the thermoelectric power generation element 1 and the thermally-responsive member 42 as indicated by arrows B1 and B2 in FIG. 3.

As a result, heat generated by the heat-generating body 2 is conveyed to the heat-dissipating body 3 via the thermoelectric power generation element 1 and the thermally-responsive body 4. In other words, heat that goes through the thermoelectric power generation element 1 is conveyed to the heat-dissipating body 3 after performing thermoelectric power generation, and heat that goes through the thermally-responsive body 4 is directly conveyed to the heat-dissipating body 3. Heat conveyed to the heat-dissipating body 3 is dissipated into the atmosphere from the heat-dissipating body 3 (refer to arrows B3). The heat conductors 41 in the thermally-responsive body 4 that are thermally connected to both the heat-generating body 2 and the heat-dissipating body 3 are indicated in gray in FIG. 4.

Note that, in FIG. 2 and FIG. 4, the heat conductors 41 are schematically arranged, and are not necessarily arranged with geometric regularity.

It is possible to reduce the overall thermal resistance between the heat-generating body 2 and the heat-dissipating body 3 in the above manner, and therefore it is possible to suppress a rise in temperature of the heat-generating body 2 and realize a longer life for a semiconductor component while also preventing the occurrence of a failure, and it is also possible to ensure an amount of power generated.

In the embodiment described above, description is given regarding an example in which the thermoelectric power generation element 1 is disposed at the approximately central section of the top surface of the heat-dissipating body 3 and the thermally-responsive body 4 is disposed at the outer peripheral section of the top surface of the heat-dissipating body 3, but there is no problem even if, conversely, the thermally-responsive body 4 is disposed at the approximately central section of the top surface of the heat-dissipating body 3 and the thermoelectric power generation element 1 is disposed at the outer peripheral section of the top surface of the heat-dissipating body 3. In addition, in the embodiment described above, description is given regarding a case in which the thermoelectric power generation element 1 disposed at the approximately central section of the top surface of the heat-dissipating body 3 has an approximately rectangular shape, but its shape is not limited to an approximately rectangular shape, and it may have a suitable shape according to an intended use or an exterior, such as an approximately circular shape, an approximately elliptical shape, or an approximately triangular shape.

In addition, the shape of the thermoelectric power generation element 1 is not limited to an approximately rectangular shape having one layer, and the thermoelectric power generation element 1 may be divided into multiple layers with the layers being connected to each other in series.

[Operation by Thermoelectric Power Generation Module at Time of High Temperature and Time of Low Temperature]

In the above description, the thermal resistance of the thermally-responsive body 4 is described as changing according to a time of high heat generation and a time of low heat generation, in other words, according to the temperature difference (temperature gradient) between the heat-generating body 2 and the heat-dissipating body 3, but in reality, the thermal resistance of the thermally-responsive body 4 is also impacted by ambient temperature. In other words, in a case where the ambient temperature is low, the absolute temperature of the thermally-responsive body 4 does not necessarily increase even if the temperature difference between the heat-generating body 2 and the heat-dissipating body 3 is large, and thus the thermally-responsive member 42 does not expand very much. Accordingly, the thermal resistance of the thermally-responsive body 4 also does not decrease.

Further, in such a case, the heat flux is concentrated in the thermoelectric power generation element 1 as indicated by the arrows A1 in FIG. 1. Accordingly, thermoelectric power generation is performed in a region where the thermoelectric conversion rate for the thermoelectric power generation element 1 is large, and thus the amount of power generated also becomes large. In addition, because the ambient temperature is low, the surface temperature of the heat-generating body 2 also does not become high. Accordingly, in a case where the heat-generating body 2 is a semiconductor component, for example, a rise in temperature does not occur, and thus there is little risk of the occurrence of a failure or the occurrence of such a malfunction as a thermal runaway.

In contrast, in a case where the ambient temperature is high, the surface temperature of the heat-generating body 2 also becomes high in conjunction therewith. Accordingly, because the absolute temperature of the thermally-responsive body 4 also increases, the thermally-responsive member 42 expands such that the thermal resistance of the thermally-responsive body 4 decreases, even if the temperature difference between the heat-generating body 2 and the heat-dissipating body 3 is not large. Accordingly, heat flux is shared by the thermoelectric power generation element 1 and the thermally-responsive member 42 as indicated by arrows B1 and B2 in FIG. 3.

As a result, the heat-dissipating body 3 dissipates conveyed heat into the atmosphere, and suppresses a rise in temperature of the heat-generating body 2. Accordingly, in a case where the heat-generating body 2 is a semiconductor component, it is possible to realize a longer life for the semiconductor component while also preventing the occurrence of a failure or the occurrence of such a malfunction as a thermal runaway. It is also possible to efficiently perform thermoelectric power generation, and thus it is possible to ensure an amount of power generated.

In other words, the thermally-responsive body 4 causes the thermal resistance to automatically change in conjunction with the temperature difference, which is between the heat-generating body 2 and the heat-dissipating body 3 and is due to the amount of heat generated by the heat-generating body 2, as well as the ambient temperature, and thus it is possible to suppress a rise in temperature of the semiconductor component which is the heat-generating body 2 while also performing efficient thermoelectric power generation.

By virtue of the present disclosure as above, the thermally-responsive body 4 is configured such that the thermal resistance thereof changes according to temperature. Therefore, in a case where the ambient temperature is low and the temperature difference between the heat-generating body 2 and the heat-dissipating body 3 is low, heat flux is concentrated in the thermoelectric power generation element 1, whereby it is possible to suppress a rise in temperature of the semiconductor component which is the heat-generating body 2 while also performing efficient thermoelectric power generation.

In addition, even in a case where the ambient temperature is low and there is a large temperature difference between the heat-generating body 2 and the heat-dissipating body 3, heat flux is similarly concentrated in the thermoelectric power generation element 1, whereby it is possible to suppress a rise in temperature of the semiconductor component which is the heat-generating body 2 while also performing efficient thermoelectric power generation.

In addition, in a case where the ambient temperature is high and there is a small temperature difference between the heat-generating body 2 and the heat-dissipating body 3, the heat flux is shared by the thermoelectric power generation element 1 and the thermally-responsive body 4, whereby it is possible to suppress a rise in temperature of the semiconductor component which is the heat-generating body 2 while also performing efficient thermoelectric power generation.

In addition, in a case where the ambient temperature is high and the temperature difference between the heat-generating body 2 and the heat-dissipating body 3 is large, a rise in temperature of the thermally-responsive body 4 will become greater. Accordingly, by the thermal resistance of the thermally-responsive body 4 being set in advance to be equal to or smaller than that of the thermoelectric power generation element 1, most of the heat flux is shared by the thermally-responsive body 4 rather than the thermoelectric power generation element 1, whereby it is possible to suppress a rise in temperature of the semiconductor component which is the heat-generating body 2 while also performing efficient thermoelectric power generation.

In other words, because the thermally-responsive body 4 is configured such that the thermal resistance thereof changes according to temperature, it is possible to suppress a rise in temperature of the heat-generating body 2 while also performing efficient thermoelectric power generation.

In the manner described above, in a case where the ambient temperature is high and a rise in temperature is also large, it is necessary to prioritize suppression of the rise in temperature. Because there are cases in which such a situation is envisioned, it is effective to perform a setting in advance such that the thermal resistance of the thermally-responsive body 4 is less than that of the thermoelectric power generation element 1.

Next, description is given regarding an embodiment of a thermoelectric power generation module 100. However, in the following description of operation for a first embodiment through a fourth embodiment, description is given regarding a relation with the temperature difference due to the amount of heat generated by the heat-generating body 2. Operation for when the ambient temperature is a high temperature and when the ambient temperature is a low temperature is similar to that in the above description, and thus description therefor is omitted in the following description of the operation for the first embodiment through the fourth embodiment.

1. First Embodiment

[Configuration of Thermally-Responsive Body]

Figure 5:
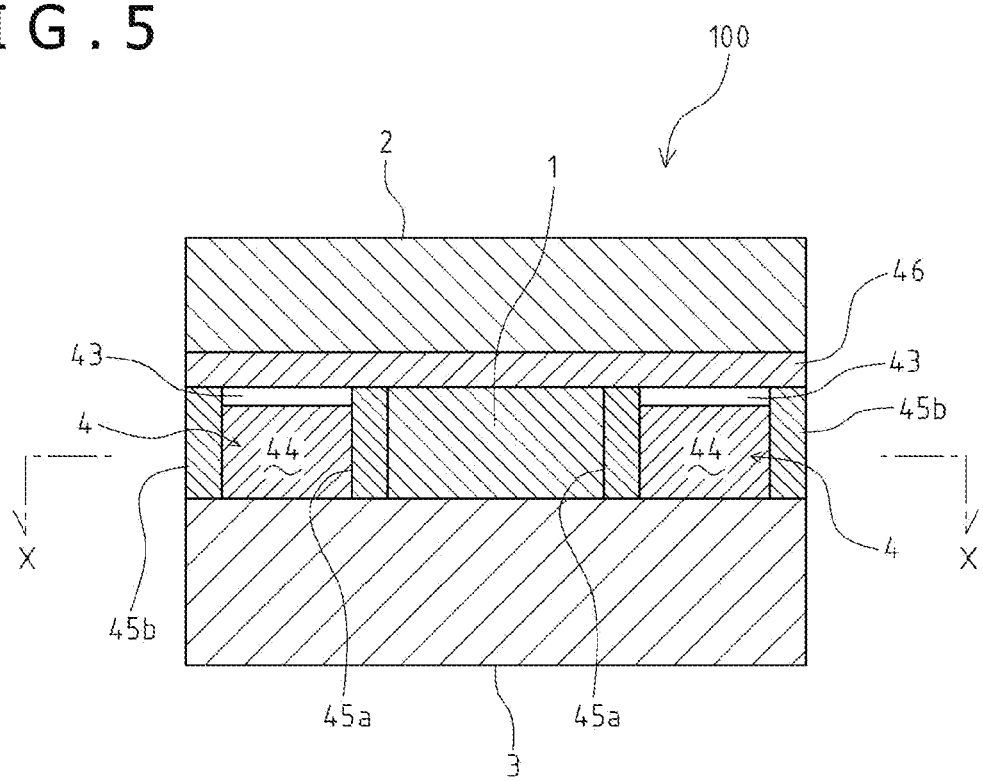
FIG. 5 is a view that illustrates an example of a configuration of a thermoelectric power generation module according to a first embodiment of the present disclosure, and operation thereby.
Figure 6:
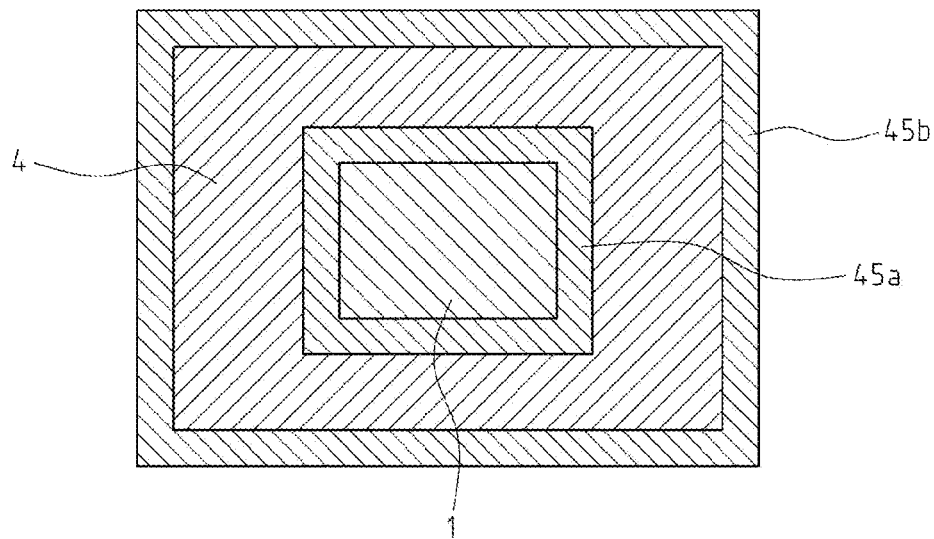
FIG. 6 is a cross-sectional view taken along arrows X-X in FIG. 5.

Description is given below regarding a configuration according to a first embodiment. As illustrated in a side-surface cross section in FIG. 5 and a cross-sectional view taken along arrows X-X in FIG. 6, in a configuration according to the present embodiment, the thermoelectric power generation element 1 is disposed at an approximately central section of the top surface of the heat-dissipating body 3, and the thermally-responsive body 4 is disposed within a cavity 44 formed with use of a material having a low coefficient of linear expansion to provide dividing walls 45a and 45b at an outer peripheral section of the thermoelectric power generation element 1 and at a periphery of the heat-dissipating body 3. In addition, a dividing wall 45c (refer to FIG. 20C) may be provided between the dividing wall 45a and the dividing wall 45b. Note that it is desirable for the dividing walls 45a, 45b, and 45c to use a material having a high thermal conductivity.

Figure 7A:
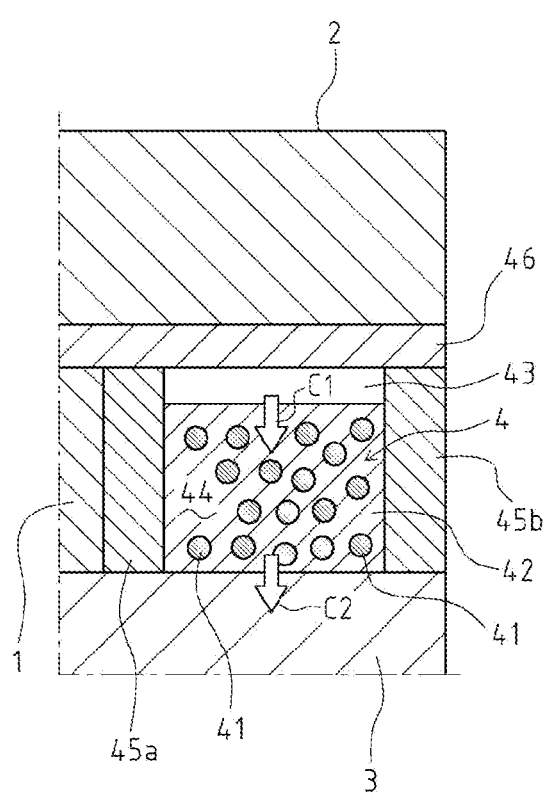
FIGS. 7A and 7B depict views that illustrate operation by the thermoelectric power generation module according to the first embodiment of the present disclosure.

The thermally-responsive body 4, which is disposed within the cavity 44, includes heat conductors 41 that are granular and a thermally-responsive member 42 which has a high coefficient of linear expansion. In other words, the thermally-responsive body 4 is formed by arranging the heat conductors 41 as illustrated in FIG. 7A and pouring in the thermally-responsive member 42. The thermally-responsive member 42 is, for example, a liquid material having a high coefficient of linear expansion (for example, 50 ppm/° C. or more), such as an epoxy resin. In addition, the heat conductors 41 are solid substances, such as carbon nanotubes, metal granules, or metal thin plates, which have high thermal conductivity (for example, 3000 to 5500 W/m·K).

The top surfaces of the thermoelectric power generation element 1 and the cavity 44 is covered by and adhered to the thermal interface material 46 which is an electrically insulating material having high thermal conductivity. As a result, the thermally-responsive body 4 is sealed, and the vacancy 43 is formed between the top surface of the thermally-responsive body 4 and the bottom surface of the thermal interface material 46. Then, the heat-generating body 2 is adhered to the top surface of the thermal interface material 46.

The vacancy 43 is provided between the top surface of the thermally-responsive body 4 and the heat-dissipating body 3. The volume of the vacancy 43 can be set to an appropriate volume by adjusting a pouring amount for the thermally-responsive member 42. By interposing the vacancy 43, the thermal resistance for the thermally-responsive body 4 in the direction from the heat-generating body 2 to the heat-dissipating body 3 is formed larger than the thermal resistance for the thermoelectric power generation element 1. The configuration according to the first embodiment is as above.

[Operation by Thermally-Responsive Body]

Next, description is given regarding operation according to the first embodiment. In a case where the heat-generating body 2 has low heat generation, a rise in temperature of the thermally-responsive body 4 is small, and there is a low temperature difference. In this case, the thermally-responsive member 42 included in the thermally-responsive body 4 does not expand. Accordingly, as illustrated by a side-surface cross section of the thermally-responsive body 4 in FIG. 7A, a state is entered in which the vacancy 43 is present and the heat-generating body 2 and the heat-dissipating body 3 are not thermally connected to each other via the thermally-responsive body 4. Accordingly, a state is entered in which the thermal resistance of the thermally-responsive body 4 is large and heat is less likely to be conveyed as indicated by arrows C1 and C2 in FIG. 7A. Accordingly, as indicated by the arrows A1 in FIG. 1, it is possible to concentrate heat flux for the low temperature difference in the thermoelectric power generation element 1, and the thermoelectric power generation element 1 can perform thermoelectric power generation in a region having a high thermoelectric conversion rate. In other words, it is possible to perform thermoelectric power generation more efficiently than when disposing the thermoelectric power generation element 1 on an entire surface of the heat-dissipating body 3.

Figure 7B:
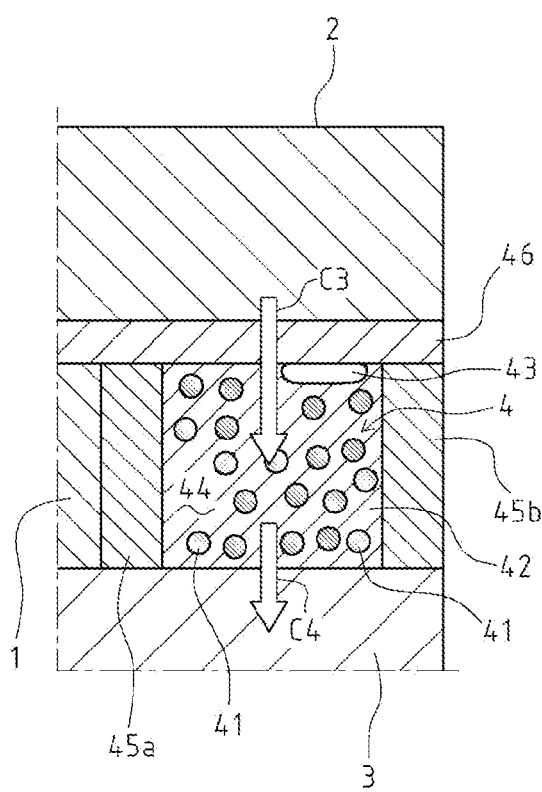

In contrast, in a case where the heat-generating body 2 has high heat generation, a rise in temperature of the thermally-responsive body 4 is large, and there is a high temperature difference. In this case, as indicated by a side-surface cross section of the thermally-responsive body 4 in FIG. 7B, the thermally-responsive member 42, which has a high coefficient of linear expansion, expands, whereby the vacancy 43 is compressed and the volume thereof shrinks. As a result, a state is entered in which the heat-generating body 2 and the heat-dissipating body 3 are thermally connected to each other via the thermally-responsive body 4. Accordingly, the thermal resistance of the thermally-responsive body 4 decreases and, as indicated by arrows C3 and C4 in FIG. 7B, more heat generated by the heat-generating body 2 can be conveyed to the heat-dissipating body 3. In other words, it is possible to reduce the overall thermal resistance between the heat-generating body 2 and the heat-dissipating body 3. As a result, it is possible for heat flux for the high temperature difference between the heat-generating body 2 and the heat-dissipating body 3 to be shared by the thermoelectric power generation element 1 and the thermally-responsive body 4 and thereby conveyed to the heat-dissipating body 3, as illustrated by the arrows B1 and B2 in FIG. 3.

The heat-dissipating body 3 dissipates conveyed heat into the atmosphere, and suppresses a rise in temperature of the heat-generating body 2. In a case where the heat-generating body 2 is a semiconductor component, it is possible to realize a longer life for the semiconductor component while also preventing the occurrence of a failure or the occurrence of such a malfunction as a thermal runaway, it is also possible to efficiently perform thermoelectric power generation, and thus it is also possible to ensure an amount of power generated.

In addition, in the present embodiment, control of an amount of expansion for achieving a predetermined thermal resistance can be designed such that it is possible to adjust a design value and an amount for a coefficient of linear expansion for a high thermal expansion material, whereby heat flux changes at a target temperature. In addition, because the heat conductors 41 are granular material, adjustment of a necessary amount is easy, and it is possible to enable control to a predetermined heat flux. Moreover, by immersing them in the thermally-responsive member 42 which is in a liquid state, the thermally-responsive member 42 penetrates gaps between the granules, and when the thermally-responsive member 42 expands or contracts in response to temperature, the heat conductors 41 move in all directions in conjunction therewith. Accordingly, it is possible to make the thermally-responsive body 4 have good thermal responsiveness without restraining expansion and contraction by the thermally-responsive member 42.

[Embodiment for Dividing Wall, Etc.]

In the above-described configuration for the thermally-responsive body 4, the height of the dividing wall 45a which surrounds the outer periphery of the thermoelectric power generation element 1 disposed on the top surface of the heat-dissipating body 3 is described as being the same as the height of the dividing wall 45b which surrounds the periphery of the thermally-responsive body 4.

Figure 8A:
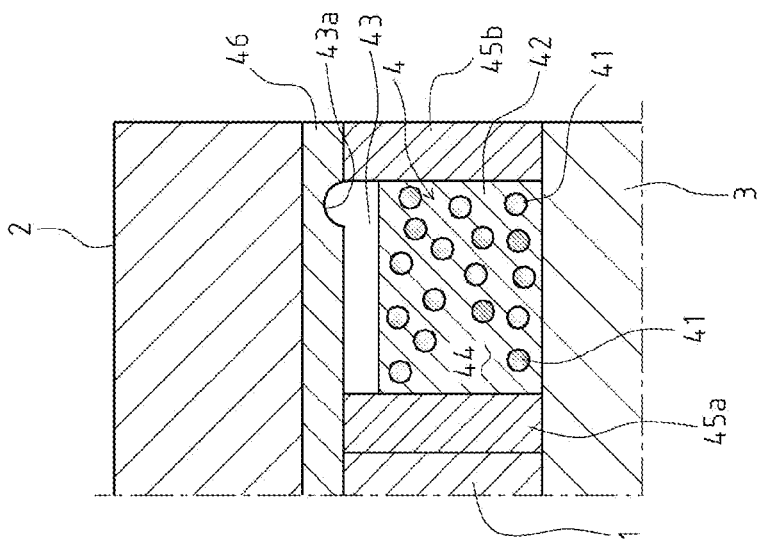
FIGS. 8A, 8B, and 8C depict views that illustrate another embodiment of a thermoelectric power generation module according to the first embodiment of the present disclosure.

Next, description is given regarding another embodiment for the dividing wall 45a and the dividing wall 45b, which relate to the shape of the vacancy 43. In the another embodiment for the dividing wall 45a and the dividing wall 45b, as illustrated in FIG. 8A, the height of the dividing wall 45a is made to be the height of the thermoelectric power generation element 1, and the height of the dividing wall 45b is made to be slightly higher than the height of the thermoelectric power generation element 1. The thermal interface material 46 covers and adheres to the top surfaces of the dividing walls 45a and the dividing wall 45b. In such a manner, the cavities 44 are formed at an outer peripheral section of the thermoelectric power generation element 1.

In other words, by setting the height of the dividing wall 45b which surrounds the periphery of the thermally-responsive body 4 to be higher than the height of the dividing wall 45a at the approximately central section, the top surface of the vacancy 43 formed at the top of the cavity 44 is inclined, and an air reservoir 43a that collects residual air from the vacancy 43 is formed at an upper section of the inner peripheral surface of the dividing wall 45b. Accordingly, when the vacancy 43 is compressed due to expansion of the thermally-responsive member 42, the vacancy 43 shrinks, the volume thereof decreases, and it is possible to collect residual air from the vacancy 43 in the air reservoir 43a formed at an upper section of the inner peripheral surface of the dividing wall 45b. In addition, by performing a setting in such a manner, it is possible to widen the surface area of the thermal connection between the heat-generating body 2 and the heat-dissipating body 3.

In addition, because a peripheral portion of the thermal interface material 46 has risen higher than an approximately central portion thereof, it is possible to cause a peripheral section of the heat-generating body 2, which is adhered to the top surface of the thermal interface material 46, to adhere to the thermal interface material 46. In other words, because the heat-generating body 2 and the thermal interface material 46, which are adhered to each other, enter a close-contact state, a gap does not arise at the adhesion surface for the two. Accordingly, the adhesiveness improves, and it is possible to reduce the thermal resistance of an adhesion portion.

Figure 8B:
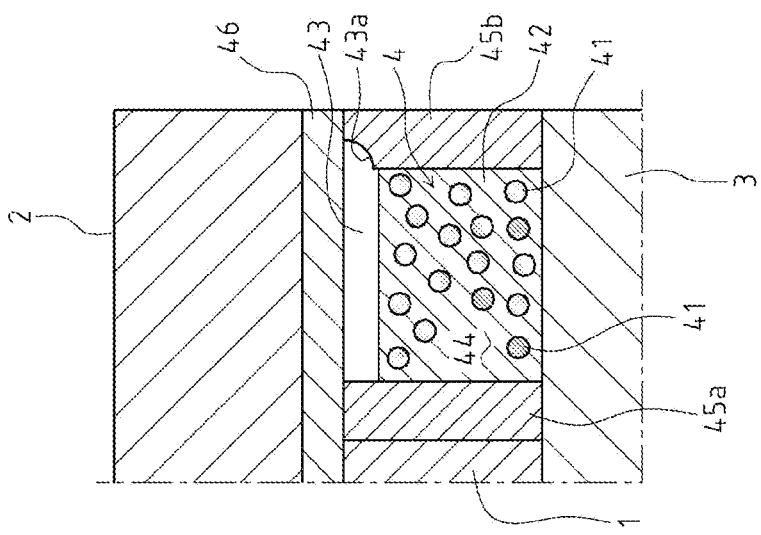

In addition, as another embodiment for the dividing wall 45a and the dividing wall 45b, the vacancy 43 may be compressed in conjunction with expansion of the thermally-responsive body 4, and in order to collect residual air from the vacancy 43 for which the volume thereof has shrunk, a recess may be provided in an upper end of the inner peripheral surface of the dividing wall 45b as the air reservoir 43a, as illustrated in FIG. 8B.

Figure 8C:
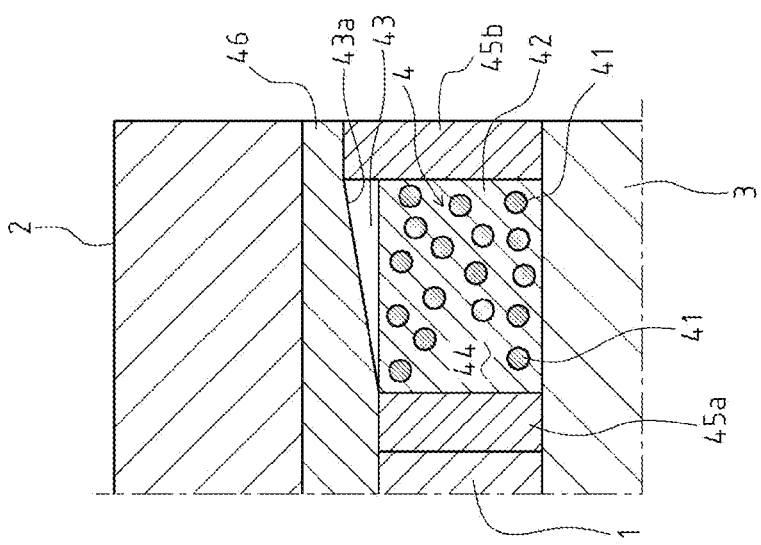

In addition, as illustrated in FIG. 8C, as the air reservoir 43a, a recess may be provided, as appropriate, in an inner surface of a portion of the thermal interface material 46, the portion covering the thermally-responsive body 4.

Moreover, the air reservoir 43a may be formed by a combination of embodiments illustrated in FIG. 8A through FIG. 8C.

By forming such an air reservoir 43a to thereby collect residual air in one location, it is possible to remove the impact of the residual air, and it is possible to reduce thermal resistance at a time of a high temperature.

Note that the other embodiments for the dividing wall 45a and the dividing wall 45b described above are similar even in a second embodiment and a fourth embodiment described below, and description thereof is omitted below.

2. Second Embodiment

[Configuration of Thermally-Responsive Body]

Next, description is given below regarding a configuration according to a second embodiment. The configuration according to the present embodiment is the same as that in the second embodiment except for the configuration of the thermally-responsive body 4. In other words, as illustrated in a side-surface cross section in FIG. 5 and a planar cross section in FIG. 6, the thermoelectric power generation element 1 is disposed at an approximately central section of the top surface of the heat-dissipating body 3, and the thermally-responsive body 4 is disposed within a cavity 44 formed with use of a material having a low coefficient of linear expansion to provide dividing walls 45a and 45b at an outer peripheral section of the thermoelectric power generation element 1 and at a periphery of the heat-dissipating body 3. Note that it is desirable for the dividing walls 45a and 45b to use a material having a high thermal conductivity.

The thermally-responsive body 4, which is disposed within the cavity 44, includes thin plate-shaped heat conductors 41 and thermally-responsive member 42 which has a high coefficient of linear expansion. In other words, as illustrated by a side-surface cross section of the thermally-responsive body 4 in FIG. 9A, the thermally-responsive body 4 is formed by inserting a predetermined number of thin plate-shaped heat conductors 41 along a horizontal direction within the cavity 44 such that the heat conductors 41 are stacked in the vertical direction and pouring the thermally-responsive member 42 in the cavity 44. The thermally-responsive member 42 is a liquid material, as in the first embodiment. In addition, the heat conductors 41 are similarly solid substances, such as carbon nanotubes or metal, which have high thermal conductivity (for example, 3000 to 5500 W/m·K).

The top surfaces of the thermoelectric power generation element 1 and the cavity 44 are covered by and adhered to the thermal interface material 46 which is an electrically insulating material having high thermal conductivity. As a result, the thermally-responsive body 4 is sealed, and the vacancy 43 is formed between the top surface of the thermally-responsive body 4 and the bottom surface of the thermal interface material 46. The heat-generating body 2 is adhered to the top surface of the thermal interface material 46.

The vacancy 43 is provided between the top surface of the thermally-responsive body 4 and the heat-dissipating body 3, as in the first embodiment. The volume of the vacancy 43 can be set by adjustment of a pouring amount for the thermally-responsive member 42. By interposing the vacancy 43, the thermal resistance for the thermally-responsive body 4 in the direction from the heat-generating body 2 to the heat-dissipating body 3 is formed larger than the thermal resistance for the thermoelectric power generation element 1.

The configuration according to the second embodiment is as above.

[Operation by Thermally-Responsive Body]

Figure 9A:
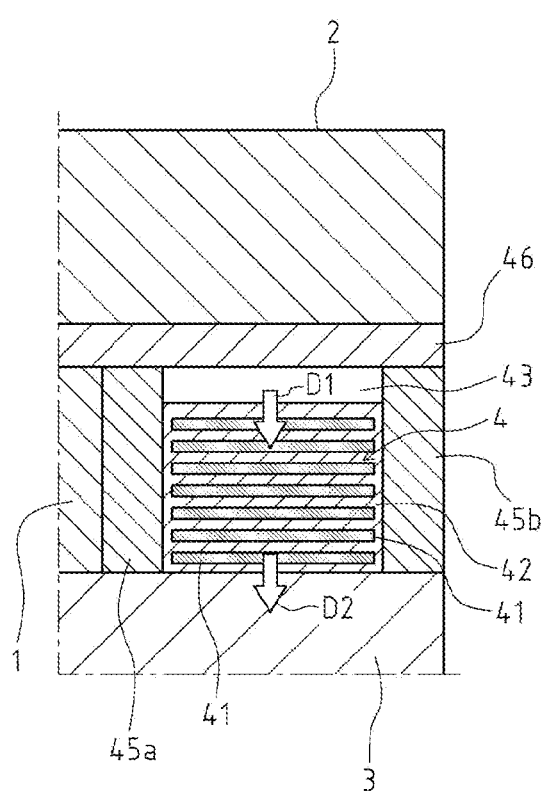
FIGS. 9A and 9B depict views that illustrate operation by a thermoelectric power generation module according to a second embodiment of the present disclosure.

Next, description is given regarding operation according to the second embodiment. In a case where the heat-generating body 2 has low heat generation, a rise in temperature of the thermally-responsive body 4 is small, and there is a low temperature difference. In this case, the thermally-responsive member 42 included in the thermally-responsive body 4 does not expand. Accordingly, as illustrated in FIG. 9A, a state is entered in which the vacancy 43 is present and the heat-generating body 2 and the heat-dissipating body 3 are not thermally connected to each other via the thermally-responsive body 4. Accordingly, a state is entered in which the thermal resistance of the thermally-responsive body 4 is high, and heat is less likely to be conveyed as indicated by arrows D1 and D2 in FIG. 9A. Accordingly, as indicated by the arrows A1 in FIG. 1, it is possible to concentrate heat flux for the low temperature difference in the thermoelectric power generation element 1, and the thermoelectric power generation element 1 can perform thermoelectric power generation in a region having a high thermoelectric conversion rate. In other words, it is possible to perform thermoelectric power generation more efficiently than when disposing the thermoelectric power generation element 1 on an entire surface of the heat-dissipating body 3.

Figure 9B:
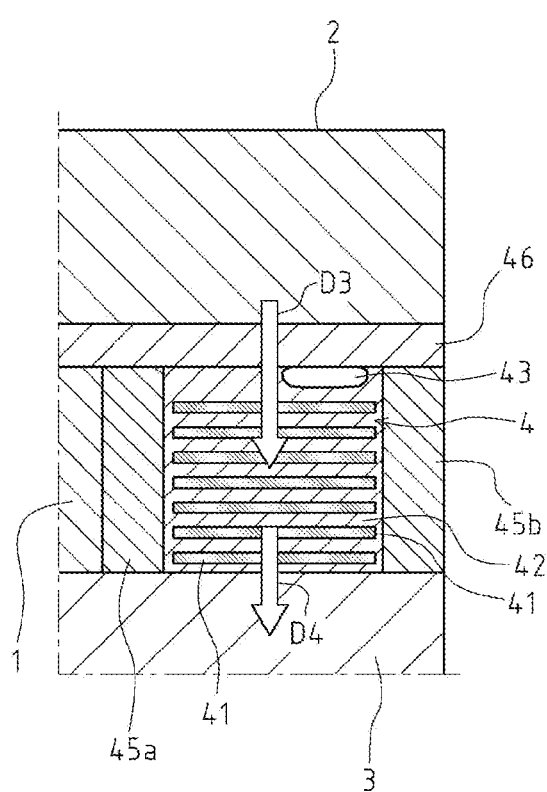

In contrast, in a case where the heat-generating body 2 has high heat generation, a rise in temperature of the thermally-responsive body 4 is large, and there is a high temperature difference. In this case, as indicated by a side-surface cross section of the thermally-responsive body 4 in FIG. 9B, the thermally-responsive member 42, which has a high coefficient of linear expansion, expands, whereby the vacancy 43 is compressed and the volume thereof shrinks. As a result, a state is entered in which the heat-generating body 2 and the heat-dissipating body 3 are thermally connected to each other via the thermally-responsive body 4. Accordingly, the thermal resistance of the thermally-responsive body 4 decreases and, as indicated by arrows D3 and D4 in FIG. 9B, more heat generated by the heat-generating body 2 can be conveyed to the heat-dissipating body 3. In other words, it is possible to reduce the overall thermal resistance between the heat-generating body 2 and the heat-dissipating body 3. As a result, it is possible for heat flux for the high temperature difference between the heat-generating body 2 and the heat-dissipating body 3 to be shared by the thermoelectric power generation element 1 and the thermally-responsive body 4 and thereby conveyed to the heat-dissipating body 3, as illustrated by the arrows B1 and B2 in FIG. 3.

The heat-dissipating body 3 dissipates conveyed heat into the atmosphere, and suppresses a rise in temperature of the heat-generating body 2. In a case where the heat-generating body 2 is a semiconductor component, it is possible to realize a longer life for the semiconductor component while also preventing the occurrence of a failure or the occurrence of such a malfunction as a thermal runaway, it is also possible to efficiently perform thermoelectric power generation, and thus it is also possible to ensure an amount of power generated.

In addition, in the present embodiment, control of an amount of expansion for achieving a predetermined thermal resistance can be designed such that it is possible to adjust a design value and an amount for a coefficient of linear expansion for a high thermal expansion material, whereby heat flux changes at a target temperature. In addition, because the heat conductors 41 are thin plate-shaped material, adjustment of a necessary number thereof is easy, and it is possible to enable control to a predetermined heat flux. Moreover, because the heat conductors 41 is immersed in the thermally-responsive member 42 which is in a liquid state, the thermally-responsive member 42 penetrates gaps in the stacking, and, when the thermally-responsive member 42 expands or contracts due to temperature, the thermally-responsive member 42 expands in the vertical direction and the heat conductors 41 also move up and down in conjunction therewith. Accordingly, it is possible to make the thermally-responsive body 4 have good thermal responsiveness without restraining expansion and contraction by the thermally-responsive member 42.

Figure 10A:
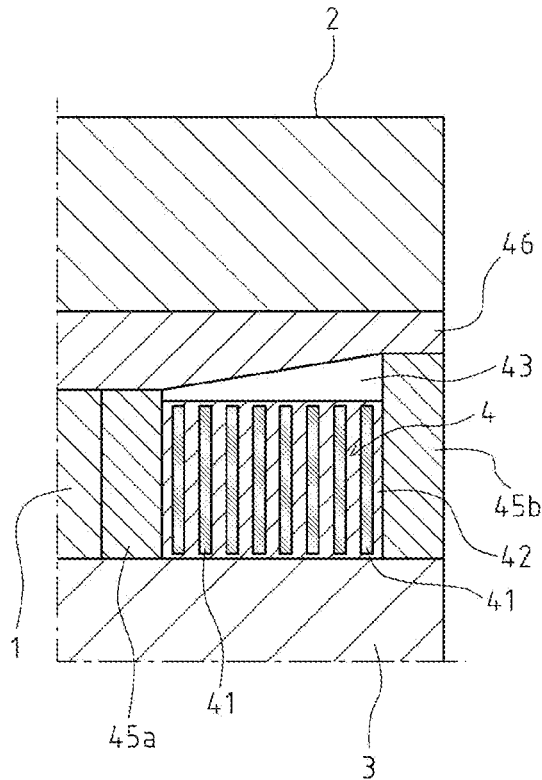
FIGS. 10A and 10B depict views that illustrate a modification of a configuration of the thermoelectric power generation module according to the second embodiment of the present disclosure.

In addition, as a modification of the second embodiment, as illustrated in FIG. 10A, formation may be performed by inserting a predetermined number of thin plate-shaped heat conductors 41 in the vertical direction within the cavity 44 to thereby be stacked in the horizontal direction and pouring the thermally-responsive member 42. In addition, for an embodiment for the vacancy 43, as illustrated in FIG. 8A, the dividing wall 45b side is made high such that the top surface of the vacancy 43 inclines, and the air reservoir 43a is formed at an upper section of an inner peripheral surface of the dividing wall 45b. By configuring in such a manner, it is possible to easily put the heat conductors 41 in and take them out when adjusting the required number thereof. In addition, if material having a high coefficient of linear expansion and equal lengths thereof is used for the heat conductors 41, there is extension in the vertical direction due to a rise in temperature. Because the height of the peripheral section of the vacancy 43 is higher, the thermally-responsive body 4 can have an action such that heat-generating body 2 and the heat-dissipating body 3 gradually thermally connect to each other from near to the thermoelectric power generation element 1 toward a peripheral section. In addition, by changing the length of the heat conductors 41 between near to the thermoelectric power generation element 1 and the peripheral section, it is possible to adjust a region where the thermal connection is made.

Figure 10B:
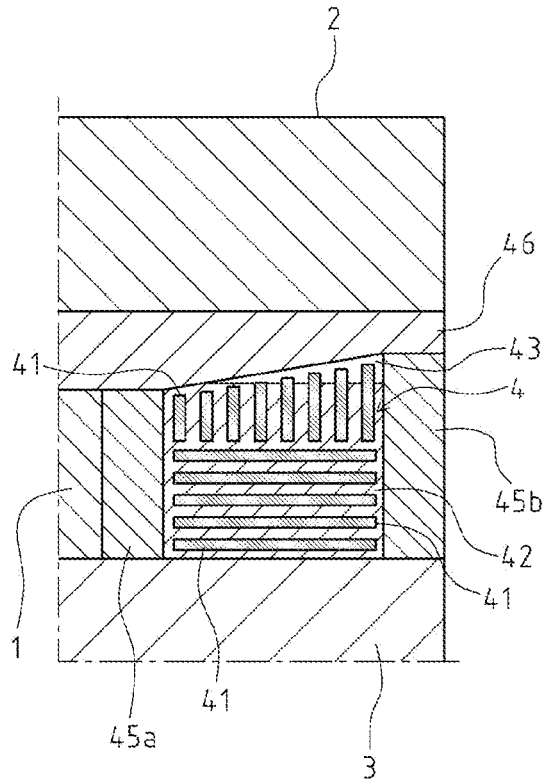

In addition, as another modification of the second embodiment, as illustrated in FIG. 10B, formation may be performed by inserting a predetermined number of thin plate-shaped heat conductors 41 along the horizontal direction in a bottom section within the cavity 44 to thereby be stacked in the vertical direction, further inserting a predetermined number of thin plate-shaped heat conductors 41 thereon along the vertical direction to thereby be stacked in the horizontal direction, and pouring the thermally-responsive member 42, whereby the vacancy 43 is made to have the mode illustrated in FIG. 8A.

By configuring in the manner described above, if a material having a high coefficient of linear expansion is used for the heat conductors 41, the heat conductors 41 which are stacked in the upper section extend in the vertical direction due to a rise in temperature. Moreover, the heat conductors 41 stacked in a lower section are lifted in the up direction by the thermally-responsive member 42 expanding. As a result, the heat conductors 41 stacked in the upper section are lifted from below and are thus more likely to come into contact with the thermal interface material 46, and it is possible to rapidly reduce the thermal resistance of the thermally-responsive body 4 at a time of high temperature. Moreover, it is possible to collect residual air from the vacancy 43 in the air reservoir 43a formed at the upper section of the inner peripheral surface of the dividing wall 45b, and thus it is possible to remove an impact by the residual air.

3. Third Embodiment

[Configuration of Thermally-Responsive Body]

Figure 11:
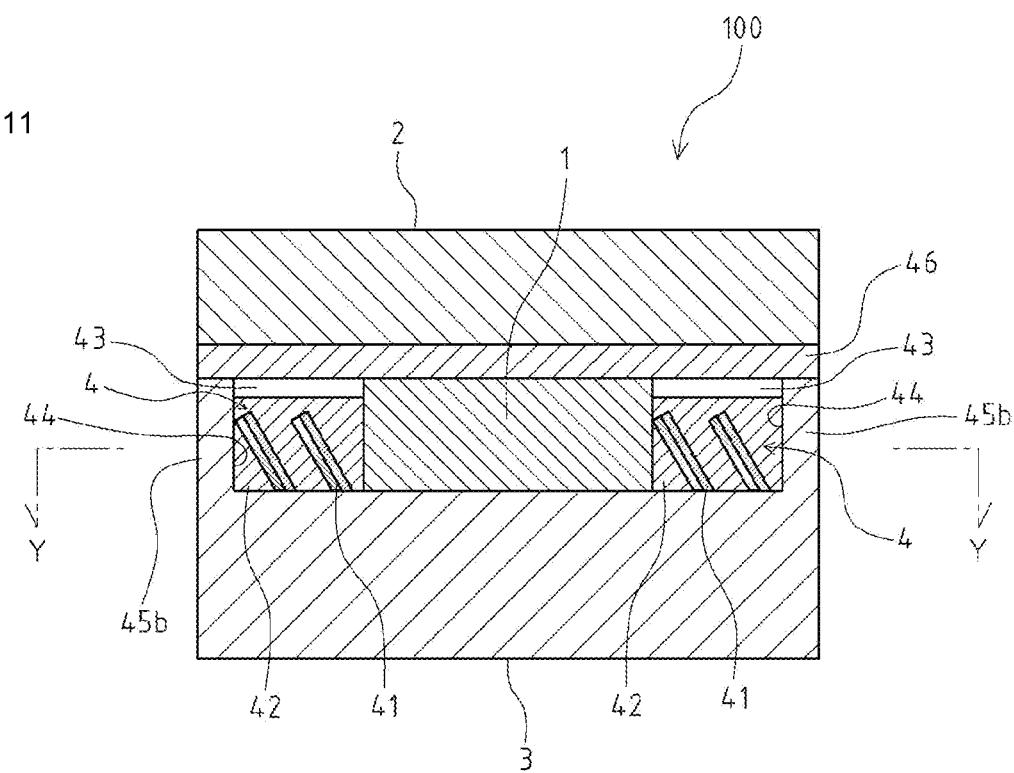
FIG. 11 is a view that illustrates an example of a configuration of a thermoelectric power generation module according to a third embodiment of the present disclosure, and operation thereby.

Description is given below regarding a configuration according to a third embodiment. In the present embodiment, as illustrated by a side-surface cross section in FIG. 11 and a cross-sectional view taken along arrows Y-Y in FIG. 12, a cavity 44 which has a predetermined size and depth and is for disposing the thermoelectric power generation element 1 and the thermally-responsive body 4 on the top surface of the heat-dissipating body 3, which has an approximately square shape, is formed. Accordingly, a peripheral side surface of the formed cavity 44 configures a dividing wall 45b. Note that a dividing wall 45a (refer to FIG. 20C) may be provided between the thermoelectric power generation element 1 and the thermally-responsive body 4, which are disposed at the approximately central section of the cavity 44. In addition, a dividing wall 45c (refer to FIG. 20C) may be provided between the dividing wall 45a and the dividing wall 45b.

By configuring in the manner described above, it is possible to form the dividing wall 45b and the heat-dissipating body 3 by the same material, and it is possible to make there be a uniform coefficient of linear expansion, while also being effective to seal the thermally-responsive member 42.

The thermally-responsive body 4 disposed within the cavity 44 includes heat conductors 41, which include a double layer structure having a high coefficient-of-linear-expansion material 41a and a low coefficient-of-linear-expansion material 41b and a liquid thermally-responsive member 42 having a high coefficient of linear expansion. In other words, as indicated by a side-surface cross section of the thermally-responsive body 4 in FIG. 13A, the thermally-responsive body 4 is formed by inclining and lining up in the horizontal direction a predetermined number of heat conductors 41 within the cavity 44, using adhesion, etc., to secure ends thereof to the heat-dissipating body 3, and pouring the thermally-responsive member 42. The thermally-responsive member 42 is a liquid material, as in the first embodiment and the second embodiment.

In addition, the heat conductors 41, for example, have a double layer structure that has materials with different coefficients of linear expansion, the materials including the high coefficient-of-linear-expansion material 41a such as a polycarbonate and the low coefficient-of-linear-expansion material 41b such as single-walled carbon nanotubes.

In addition, the vacancy 43 is formed between the top surface of the thermally-responsive body 4 and the heat-dissipating body 3, as in the first embodiment.

The configuration according to the third embodiment is as above.

[Operation by Thermally-Responsive Body]

Next, description is given regarding operation according to the third embodiment. In a case where the heat-generating body 2 has low heat generation, a rise in temperature of the thermally-responsive body 4 is small, and there is a low temperature difference. In this case, the thermally-responsive member 42 included in the thermally-responsive body 4 does not expand. In addition, also in the heat conductors 41, which include a double layer structure having the high coefficient-of-linear-expansion material 41a and the low coefficient-of-linear-expansion material 41b, the high coefficient-of-linear-expansion material 41a does not expand due to a rise in temperature. Accordingly, as illustrated in FIG. 13A, a state is entered in which the vacancy 43 is present and the heat-generating body 2 and the heat-dissipating body 3 are not thermally connected to each other via the thermally-responsive body 4.

Figure 13A:
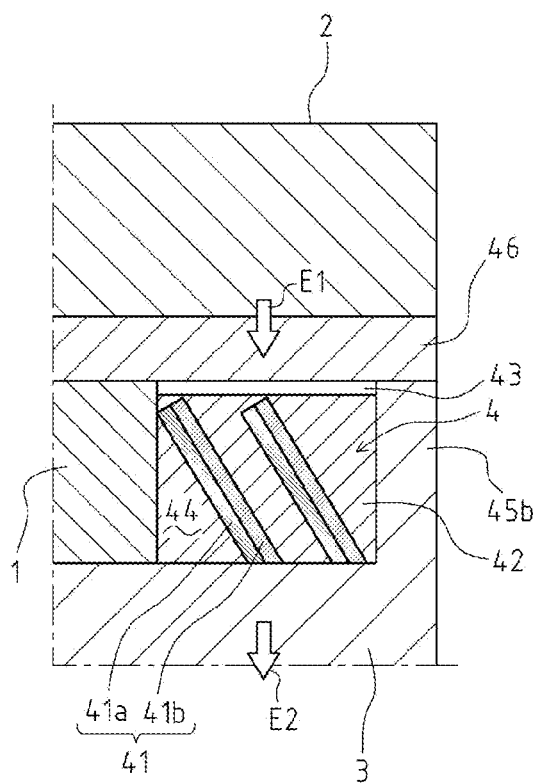
FIGS. 13A and 13B depict views that illustrate operation by a thermoelectric power generation module according to a third embodiment of the present disclosure.

Accordingly, a state is entered in which the thermal resistance of the thermally-responsive body 4 is large, and heat is less likely to be conveyed as indicated by arrows E1 and E2 in FIG. 13A. Accordingly, as indicated by the arrows A1 in FIG. 1, it is possible to concentrate heat flux for the low temperature difference in the thermoelectric power generation element 1, and the thermoelectric power generation element 1 can perform thermoelectric power generation in a region having a high thermoelectric conversion rate. In other words, it is possible to perform thermoelectric power generation more efficiently than when disposing the thermoelectric power generation element 1 on an entire surface of the heat-dissipating body 3.

In contrast, in a case where the heat-generating body 2 has high heat generation, a rise in temperature of the thermally-responsive body 4 is large, and there is a high temperature difference. In this case, as indicated by a side-surface cross section of the thermally-responsive body 4 in FIG. 13B, the thermally-responsive member 42, which has a high coefficient of linear expansion, expands, whereby the vacancy 43 is compressed and the volume thereof shrinks. In addition, for the heat conductors 41, which include the double layer structure having the high coefficient-of-linear-expansion material 41a and the low coefficient-of-linear-expansion material 41b, the high coefficient-of-linear-expansion material 41a extends due to the rise in temperature, the low coefficient-of-linear-expansion material 41b side bends inward, and the heat conductors 41, which have been disposed in an inclined fashion, stand upright. As a result, a state is entered in which the heat-generating body 2 and the heat-dissipating body 3 are thermally connected to each other via the thermally-responsive body 4.

Figure 13B:
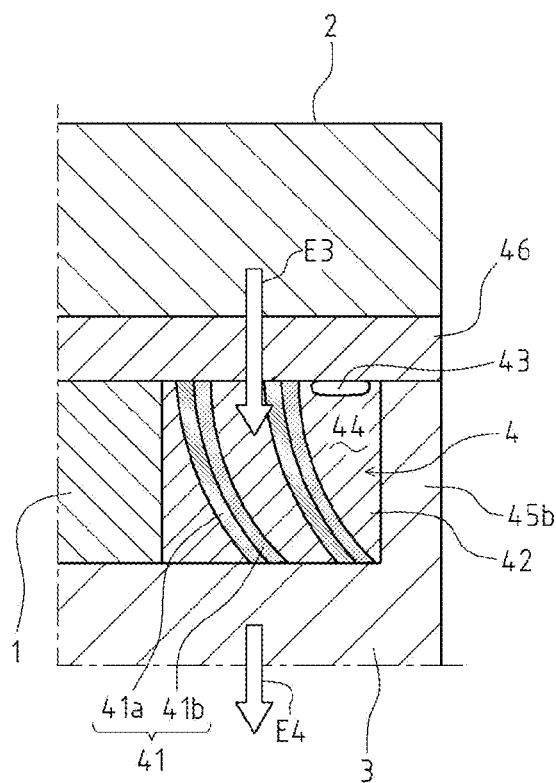

Accordingly, the thermal resistance of the thermally-responsive body 4 decreases and, as indicated by arrows E3 and E4 in FIG. 13B, more heat generated by the heat-generating body 2 can be conveyed to the heat-dissipating body 3. In other words, it is possible to reduce the overall thermal resistance between the heat-generating body 2 and the heat-dissipating body 3. As a result, it is possible for heat flux for the high temperature difference between the heat-generating body 2 and the heat-dissipating body 3 to be shared by the thermoelectric power generation element 1 and the thermally-responsive body 4 and thereby conveyed to the heat-dissipating body 3, as illustrated by the arrows B1 and B2 in FIG. 3.

The heat-dissipating body 3 dissipates conveyed heat into the atmosphere, and suppresses a rise in temperature of the heat-generating body 2. In a case where the heat-generating body 2 is a semiconductor component, it is possible to realize a longer life for the semiconductor component while also preventing the occurrence of a failure or the occurrence of such a malfunction as a thermal runaway, it is also possible to efficiently perform thermoelectric power generation, and thus it is also possible to ensure an amount of power generated.

In addition, in the present embodiment, the heat conductors 41 are formed with a double layer structure having the high coefficient-of-linear-expansion material 41a and the low coefficient-of-linear-expansion material 41b, and thus can bend in conjunction with a rise in temperature, with tips thereof changing from an inclined state to an upright state to come into contact with the thermal interface material 46 which covers thereabove. Accordingly, there is a large stroke from the bent state to the upright state. Accordingly, control of an amount of expansion for achieving a predetermined thermal resistance can be designed such that it is possible to adjust a design value and an amount for a coefficient of linear expansion for a high thermal expansion material, whereby heat flux changes at a target temperature. In addition, the is possible to thermally connect the heat-generating body 2 and the heat-dissipating body 3 directly to each other, and it is possible to increase change of the thermal resistance for the thermally-responsive body 4.

In addition, the present embodiment realizes change of the thermal resistance by bending the heat conductors 41. Because change of the thermal resistance is not realized by compressing the vacancy 43 according to expansion of the thermally-responsive member 42, as in the first embodiment and the second embodiment, pouring of the liquid thermally-responsive member 42 is not necessarily required. Further, a case in which the thermally-responsive member 42 is unused leads to a cutback of material costs therefor, and thus a cost reduction can be realized. In addition, a countermeasure for the leakage of liquid becomes unnecessary for the cavity 44, and thus a seal may be something simple.

4. Fourth Embodiment

[Configuration of Thermally-Responsive Body]

Next, description is given below regarding a configuration according to a fourth embodiment. In the present embodiment, as illustrated by a side-surface cross section in FIG. 14 and a plan view in FIG. 12, a hole is made to a predetermined depth in the top surface of the heat-dissipating body 3, and the cavity 44 is formed as in the third embodiment. Further, the thermoelectric power generation element 1, which has a protrusion at an approximately central section thereof is disposed in the cavity 44, and the thermally-responsive body 4 is disposed at an outer peripheral section of the protrusion. In addition, the height of the protrusion of the thermoelectric power generation element 1 is set to be approximately equal to the height of the top surface of a dividing wall 43b.

Figure 12:
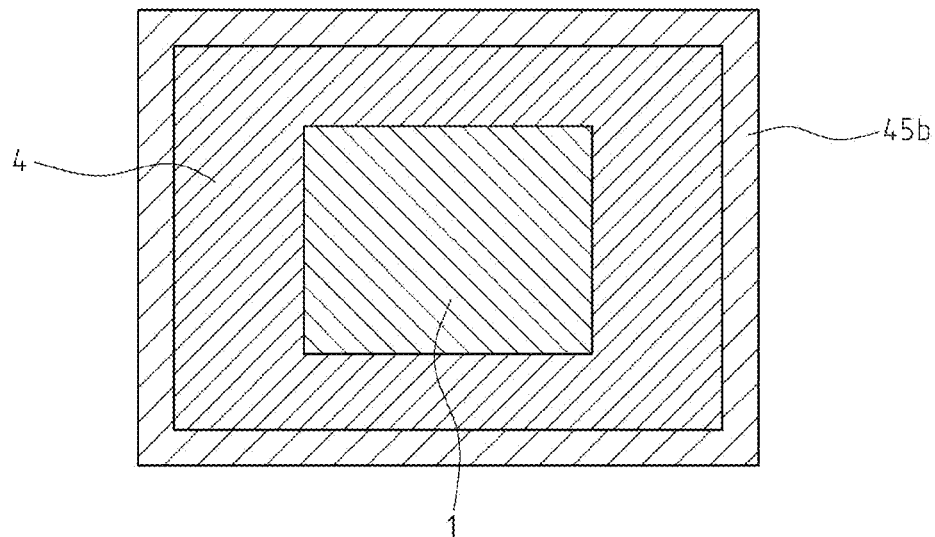
FIG. 12 is a cross-sectional view taken along arrows Y-Y in FIG. 11.
Figure 14:
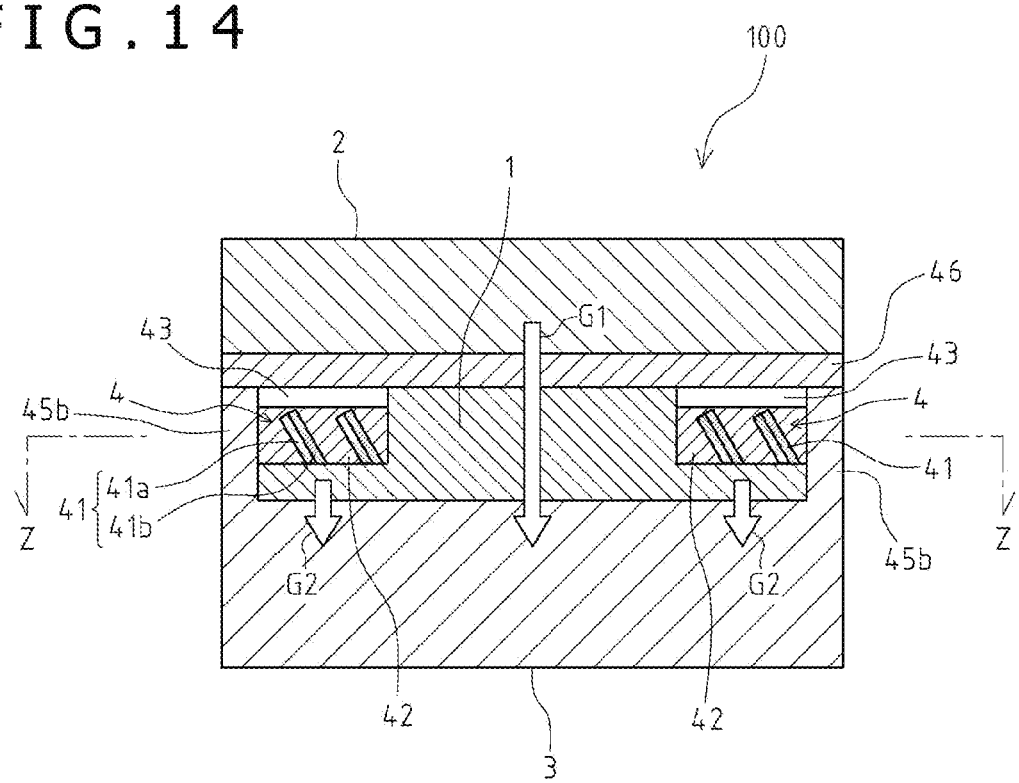
FIG. 14 is a view that illustrates an example of a configuration of a thermoelectric power generation module according to a fourth embodiment of the present disclosure.

Note that a cross-sectional view taken along arrows Z-Z in FIG. 14 for the present embodiment is the same as in FIG. 12.

As in the third embodiment, for example, the thermally-responsive body 4 disposed within the cavity 44 includes heat conductors 41, which have high thermal conductivity and include a double layer structure resulting from joining together a high coefficient-of-linear-expansion material 41a such as a polycarbonate and a low coefficient-of-linear-expansion material 41b such as single-walled carbon nanotubes, and a liquid thermally-responsive member 42 having a high coefficient of linear expansion. In other words, as illustrated in FIG. 14, the thermally-responsive body 4 is formed by inclining and lining up in the horizontal direction a predetermined number of heat conductors 41 which include a double layer structure within the cavity 44, using adhesion, etc., to secure ends thereof to the outer peripheral section of the protrusion of the thermoelectric power generation element 1, and pouring the thermally-responsive member 42. The thermally-responsive member 42 is a liquid material, as in the first embodiment through the third embodiment.

In addition, the vacancy 43 is formed between the top surface of the thermally-responsive body 4 and the heat-dissipating body 3, as in the first embodiment.

The configuration according to the fourth embodiment is as above.

[Operation by Thermally-Responsive Body]

Next, description is given regarding operation according to the fourth embodiment. In a case where the heat-generating body 2 has low heat generation, a rise in temperature of the thermally-responsive body 4 is small, and there is a low temperature difference. In this case, the thermally-responsive member 42 included in the thermally-responsive body 4 does not expand. In addition, the heat conductors 41, which include a double layer structure having the high coefficient-of-linear-expansion material 41a and the low coefficient-of-linear-expansion material 41b, also do not bend because the high coefficient-of-linear-expansion material 41a has not extended due to a rise in temperature.

Accordingly, as illustrated in FIG. 14, a state is entered in which the vacancy 43 is present and the heat-generating body 2 and the heat-dissipating body 3 are not thermally connected to each other via the thermally-responsive body 4.

Accordingly, a state is entered in which the thermal resistance of the thermally-responsive body 4 is large, and the thermally-responsive body 4 is less likely to convey heat as indicated by arrows G1 and G2 in FIG. 14. Accordingly, as indicated by this figure, it is possible to concentrate heat flux for the low temperature difference in the thermoelectric power generation element 1, and the thermoelectric power generation element 1 can perform thermoelectric power generation in a region having a high thermoelectric conversion rate. In other words, it is possible to perform thermoelectric power generation more efficiently than when disposing the thermoelectric power generation element 1 on an entire surface of the heat-dissipating body 3.

In contrast, in a case where the heat-generating body 2 has high heat generation, a rise in temperature of the thermally-responsive body 4 is large, and there is a high temperature difference. In this case, as indicated by a side-surface cross section in FIG. 15, the thermally-responsive member 42, which has a high coefficient of linear expansion, expands, whereby the vacancy 43 is compressed and the volume thereof shrinks and gets small. Accordingly, the thermal connection between the heat-generating body 2 and the heat-dissipating body 3 gradually widens from near to the thermoelectric power generation element 1 toward a peripheral section, via the thermally-responsive member 42 in the thermally-responsive body 4.

In addition, for the heat conductors 41, which include the double layer structure having the high coefficient-of-linear-expansion material 41a and the low coefficient-of-linear-expansion material 41b, the high coefficient-of-linear-expansion material 41a extends due to the rise in temperature, and the low coefficient-of-linear-expansion material 41b side bends inward. As a result, the heat conductors 41, which have been disposed in an inclined manner, stand upright and come into contact with the heat-dissipating body 3. As a result, a state is entered in which the heat-generating body 2 and the heat-dissipating body 3 are thermally connected to each other via the thermally-responsive body 4. Moreover, the protrusion which is at the approximately central section of the thermoelectric power generation element 1 has a greater increase in temperature than the peripheral section, and thus the heat conductors 41 near the approximately central section stand upright first and thus come into contact with the heat-dissipating body 3. Accordingly, in conjunction with a rise in temperature, the surface area where the heat-generating body 2 and the heat-dissipating body 3 thermally connect to each other increases.

Figure 15:
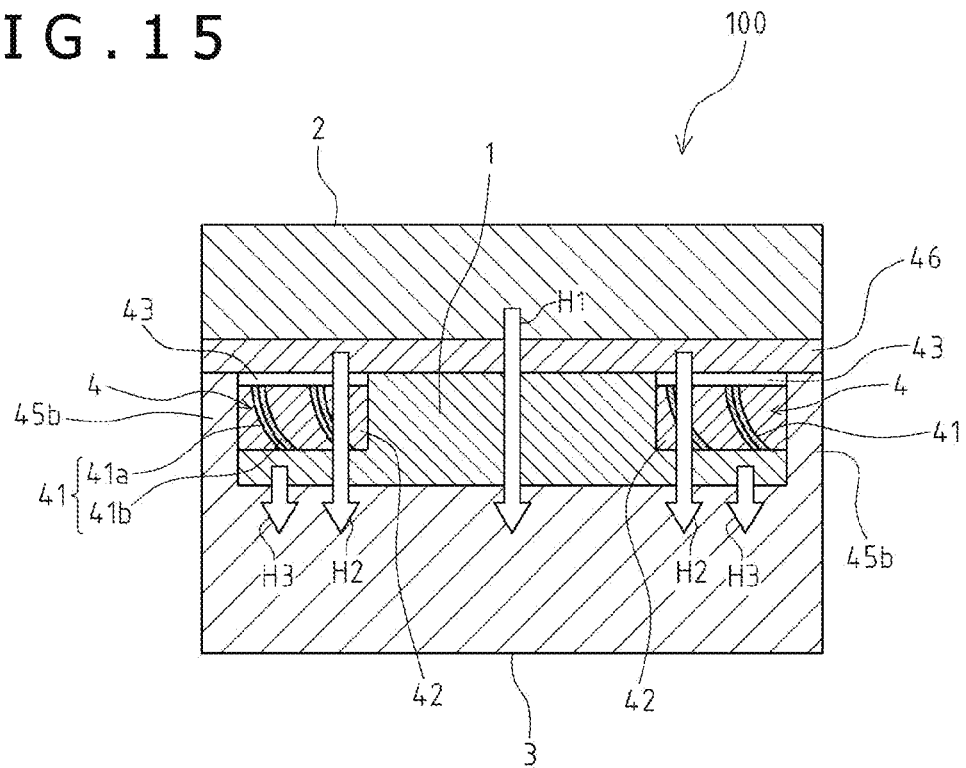
FIG. 15 is a view that illustrates operation by the thermoelectric power generation module according to the fourth embodiment of the present disclosure.

Accordingly, the thermal resistance for the thermally-responsive body 4 in a part near the approximately central section of the thermoelectric power generation element 1 decreases more than the peripheral section thereof, and the part near the approximately central section conveys more heat as indicated by the arrows H1, H2, and H3 in FIG. 15.

Figure 16A:
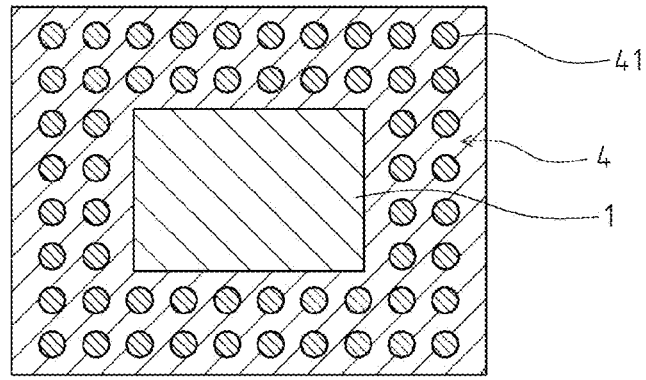
FIGS. 16A, 16B, and 16C depict views that illustrate operation by the thermoelectric power generation module according to the fourth embodiment of the present disclosure.
Figure 16B:
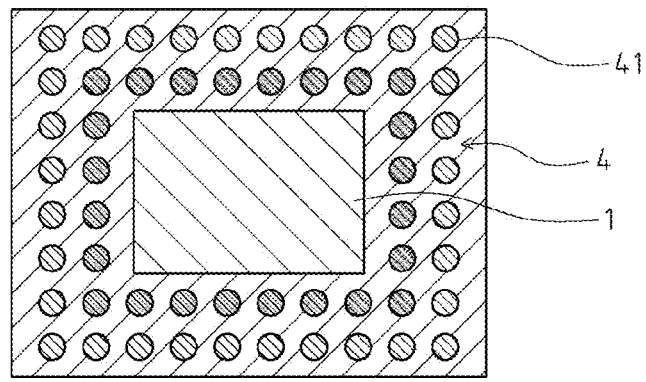
Figure 16C:
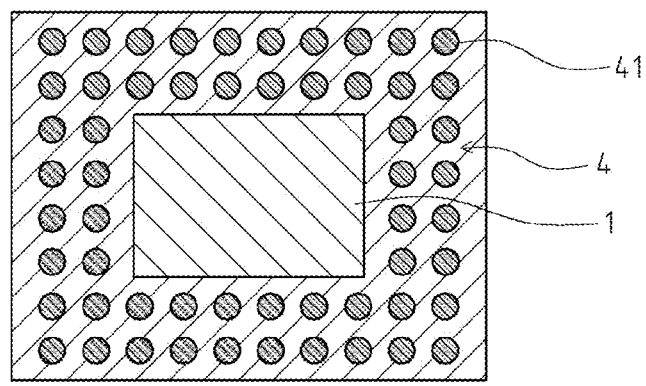

Widening of the thermal connection by the thermally-responsive body 4 as above is illustrated in FIGS. 16A, 16B, and 16C. In this figure, gray portions indicate regions where the thermal resistance has decreased due to the thermal connection. FIG. 16A indicates a case for 50 degrees, for example, in a state for a low temperature difference. FIG. 16B indicates a case for 100 degrees, for example, in a state for a medium temperature difference. FIG. 16C indicates a case for 150 degrees, for example, in a state for a high temperature difference. As indicated in each figure, the surface area in which a thermal connection is made widens as the temperature difference increases, and thus the thermal resistance decreases.

Figure 17:
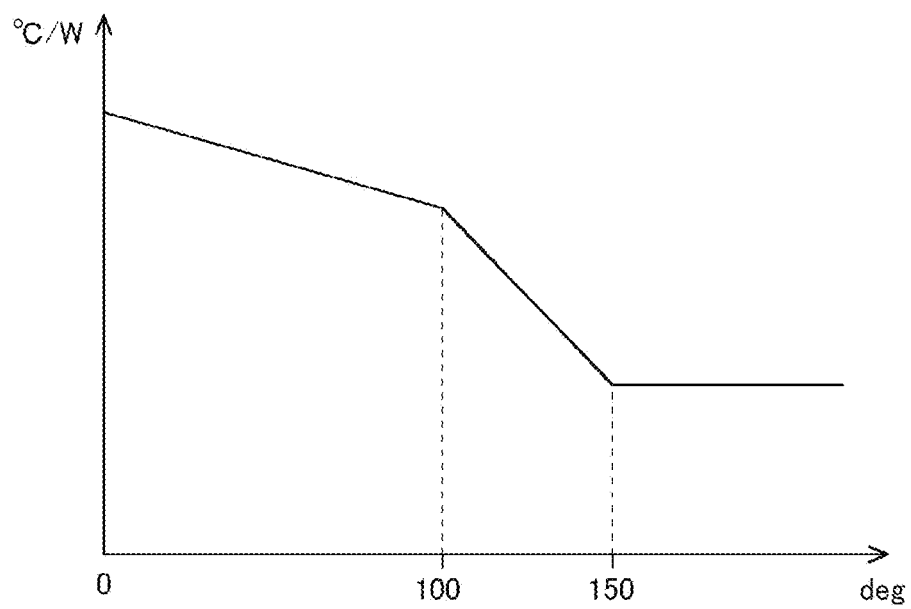
FIG. 17 is a view that illustrates an example of a relation between a temperature difference and thermal resistance for the thermoelectric power generation module according to the fourth embodiment of the present disclosure.

Accordingly, the relation between the temperature difference, which is between the heat-generating body 2 and the heat-dissipating body 3, and the thermal resistance changes as illustrated in FIG. 17.

In the manner described above, it is possible to convey more heat to the heat-dissipating body 3 in response to heat generated by the heat-generating body 2 increasing. In other words, it is possible to reduce the thermal resistance between the heat-generating body 2 and the heat-dissipating body 3 in conjunction with an increase of heat generated by the heat-generating body 2, whereby thermoelectric power generation is performed more efficiently while also conveying heat to the heat-dissipating body 3 via the thermoelectric power generation element 1 and the thermally-responsive body 4.

The heat-dissipating body 3 dissipates conveyed heat into the atmosphere, and suppresses a rise in temperature of the heat-generating body 2. In a case where the heat-generating body 2 is a semiconductor component, it is possible to realize a longer life for the semiconductor component while also preventing the occurrence of a failure or the occurrence of such a malfunction as a thermal runaway, it is also possible to efficiently perform thermoelectric power generation, and thus it is also possible to ensure an amount of power generated.

In addition, in the present embodiment, the heat conductors 41 are formed with a double layer structure having the high coefficient-of-linear-expansion material 41*a* and the low coefficient-of-linear-expansion material 41*b*. Accordingly, they bend in conjunction with a rise in temperature, and tips thereof change from an inclined state to an upright state to thereby come into contact with the thermal interface material 46 which covers thereabove. As a result, it is possible to thermally connect the heat-generating body 2 and the heat-dissipating body 3 directly to each other, and it is possible to increase change of the thermal resistance for the thermally-responsive body 4.

In addition, the present embodiment does not realize change of the thermal resistance by compressing the vacancy 43 according to expansion of the thermally-responsive member 42, as in the first embodiment and the second embodiment, pouring of the liquid thermally-responsive member 42 is not necessarily required. Further, a case in which the thermally-responsive member 42 is unused leads to a cutback of material costs therefor, and thus a cost reduction can be realized. In addition, a countermeasure for the leakage of liquid becomes unnecessary for the cavity 44, and thus a seal may be something simple.

In addition, in the present embodiment, the heat flux passes through the thermally-responsive body 4 and the thermoelectric power generation element 1 which is disposed thereunder, and thus it is possible to perform thermoelectric power generation even according to a temperature difference that is between the heat-generating body 2 and the heat-dissipating body 3 and that passes through the thermally-responsive body 4. Accordingly, it is possible to increase an amount of power generated by each single module, and it is possible to ensure a greater amount of power generated.

In addition, in order to gradually control the amount of power generated according to temperature, it is possible to change a combination of materials for the high coefficient-of-linear-expansion material 41*a* and the low coefficient-of-linear-expansion material 41*b* which configure the double layer structure, to thereby control an amount of bending with respect to temperature, or it is possible to change the amounts of materials that configure the double layer structure for each individual heat conductor 41, to thereby control a thermal response rate. In addition, it is possible to change the content of a high heat conductor for each individual heat conductor 41 to thereby control a thermally-responsive body efficiency, or it is possible to change and control the coefficient of thermal expansion for the heat conductors 41 and the thermally-responsive member 42. In addition, it is possible to change the thickness of the thermally-responsive body 4 for each individual heat conductor 41 to thereby control the thermal response rate, or it is possible to change and control the coefficient of thermal expansion for the heat conductors 41 and the thermally-responsive member 42.

Figure 18:
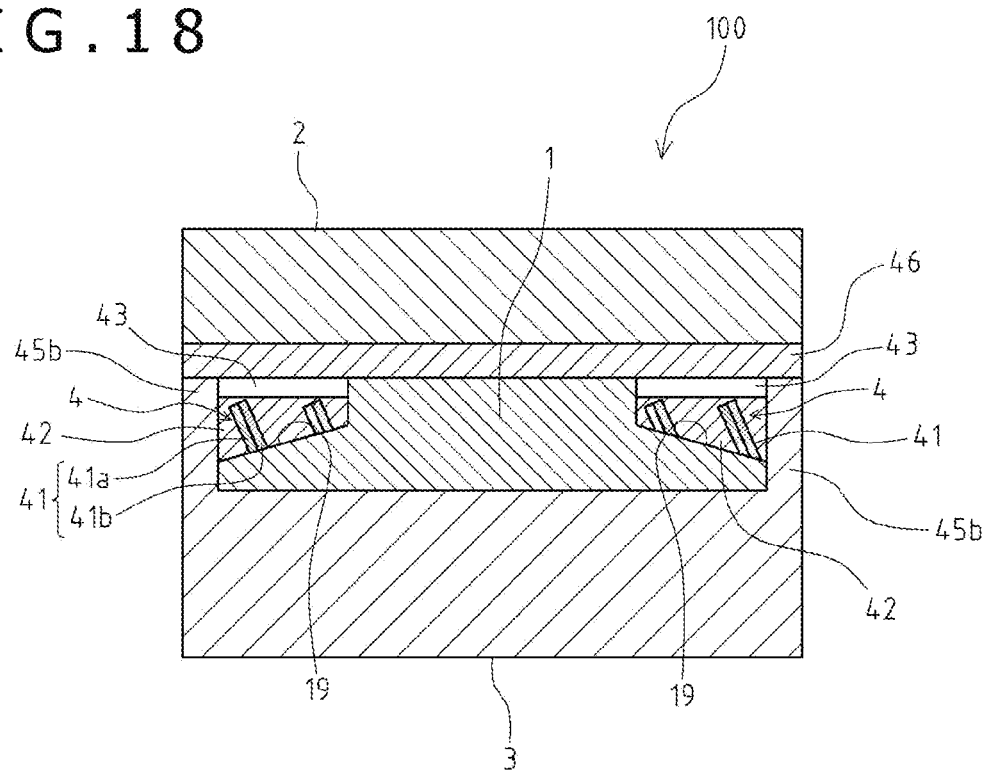
FIG. 18 is a view that illustrates an example of a configuration of the thermoelectric power generation module according to the fourth embodiment of the present disclosure.

Moreover, in the above description, the outer peripheral section of the protrusion belonging to the thermoelectric power generation element 1 disposed in the cavity 44 is described as being a horizontal surface, as illustrated in FIG. 14, but there is no limitation to a horizontal surface. For example, as illustrated in FIG. 18, the top surface of the outer peripheral section of the thermoelectric power generation element 1 may be formed as a surface that inclines from the approximately central section thereof toward the peripheral section thereof. By forming such inclined surfaces 19, it is possible to realize an approximately linear temperature difference characteristic for thermal resistance, as illustrated in FIG. 19. In addition, it is possible to change the angle of inclination of these inclined surfaces, have the inclined surfaces be curved surfaces, or change the thickness of the inclined surfaces, to thereby realize various temperature difference characteristics for thermal resistance. Accordingly, it is possible to select an optimal temperature characteristic for thermal resistance, according to an intended use.

In addition, the inclined surfaces 19 may be provided in the thermoelectric power generation element 1 according to the first embodiment through the third embodiment. Conversely, any thermally-responsive body 4 described in the first embodiment through the fourth embodiment may be combined with the thermoelectric power generation element 1 having the shape illustrated in FIG. 6C.

5. First Embodiment of Manufacturing Method

Next, FIGS. 20A, 20B, 20C, 20D, 20E, and 20F are used to give a description regarding a first embodiment for a method of manufacturing the thermoelectric power generation module 100.

Figure 20A:
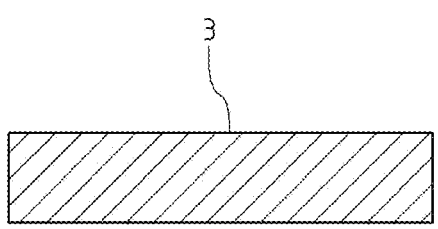
FIGS. 20A, 20B, 20C, 20D, 20E, and 20F depict views that illustrate a first embodiment of a method of manufacturing the thermoelectric power generation module according to the present disclosure.

As illustrated in FIG. 20A, a heat-dissipating body 3, which is cut into a thin plate shape having predetermined dimensions, is prepared. The heat-dissipating body 3 is, for example, a heat sink formed by cutting such a heat conductor as plate-shaped aluminum into predetermined dimensions. To improve heat dissipation, the heat sink may be provided with a heat dissipation fins (not illustrated) on a lower surface in the present figure.

Figure 20B:
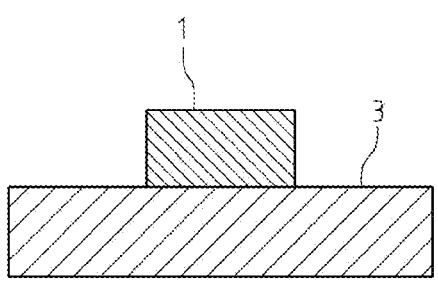

Next, as illustrated in FIG. 20B, the thermoelectric power generation element 1, which has an approximately rectangular shape and a predetermined thickness, is disposed at the approximately central section of the top surface of the heat-dissipating body 3.

Figure 20C:
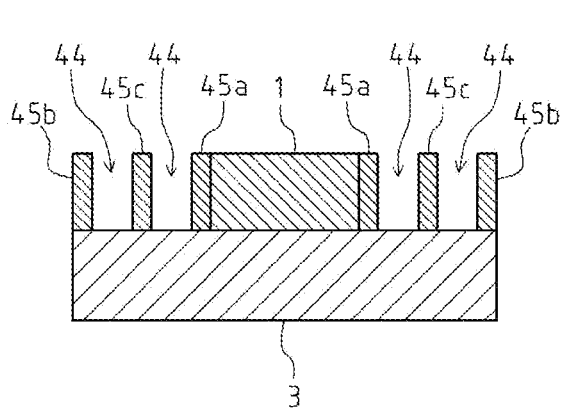

Next, as illustrated in FIG. 20C, dividing walls 45*a*, 45*c*, and 45*b* are disposed from near the thermoelectric power generation element 1 toward a peripheral section in such a manner as to surround the outer periphery of the thermoelectric power generation element 1 which is disposed on the top surface of the heat-dissipating body 3. Here, the heights of the dividing walls 45*a*, 45*b*, and 45*c* are each the same as the height of the thermoelectric power generation element 1.

Alternatively, the height of the dividing wall 45a is made to be the same as the height of the thermoelectric power generation element 1, the height of the dividing wall 45c is made to be slightly higher than the height of the thermoelectric power generation element 1, and the height of the dividing wall 45b is made to be slightly higher than the height of the dividing wall 45c. In the above-described manner, the cavities 44 are formed at an outer peripheral section of the thermoelectric power generation element 1.

By setting the heights of the dividing walls 45a, 45b, and 45c to the latter heights, when the thermally-responsive member 42 expands, it is possible to collect, at the peripheral section of the thermoelectric power generation module 100, residual air from the vacancy 43 formed at an upper section of the cavities 44. Note that, regarding the dividing wall 45c which is an intermediate dividing wall, although description is given regarding examples of providing one dividing wall 45c in embodiments according to the present disclosure, two or more of the dividing walls 45c may be provided as surrounding walls that surround the thermoelectric power generation element 1, but do not need to be provided.

Figure 20D:
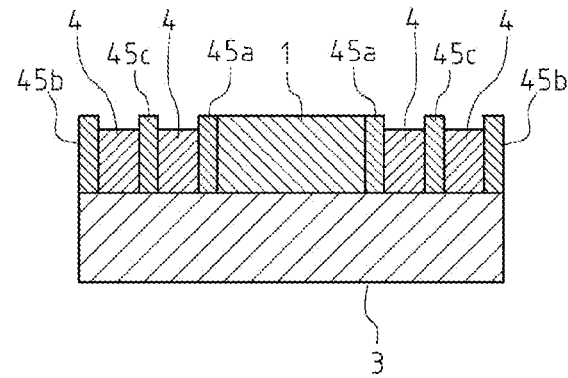

Next, as illustrated in FIG. 20D, the thermally-responsive body 4 is disposed in the cavities 44 formed at the outer peripheral section of the thermoelectric power generation element 1. In other words, heat conductors 41 are disposed and a liquid thermally-responsive member 42 is poured in. Embodiments of the thermally-responsive body 4 are not particularly limited. For example, it may be one of the first embodiment through the fourth embodiment, or something else.

Figure 20E:
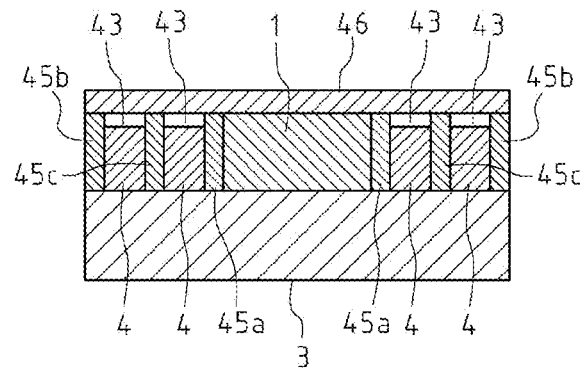

Next, as illustrated in FIG. 20E, the top surfaces of the thermoelectric power generation element 1 and the cavities 44 are covered by and adhered to a thermal interface material 46 which is an electrically insulating material having high thermal conductivity. As a result, the thermally-responsive body 4 is sealed, and vacancies 43 are formed at the top surface of the thermally-responsive body 4.

Figure 20F:
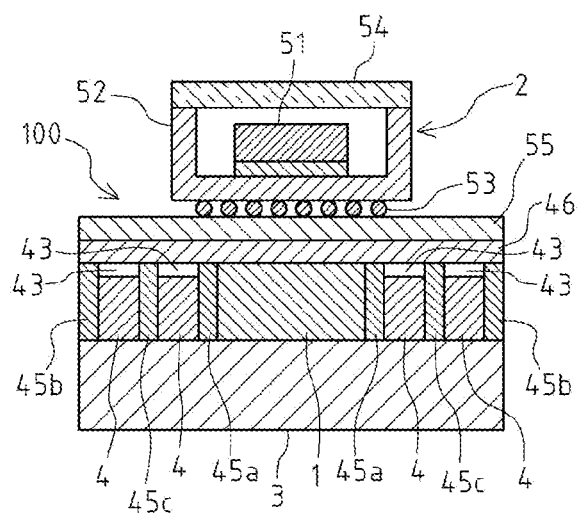

Next, as illustrated in FIG. 20F, an adhesive having a high thermal conductivity is applied to the top surface of the thermal interface material 46, and a heat-generating body 2 is adhered thereto. The heat-generating body 2 is, for example, a semiconductor component having high power consumption, such as a CMOS image sensor, a microcomputer, or a power semiconductor.

This figure depicts a CMOS image sensor which is described below.

By such steps as the above, it is possible to manufacture the thermoelectric power generation module 100.

6. Second Embodiment of Manufacturing Method

Next, FIGS. 21A, 21B, 21C, 21D, 21E, 21F, and 21G are used to give a description regarding a second embodiment for a method of manufacturing the thermoelectric power generation module 100.

Figure 21A:
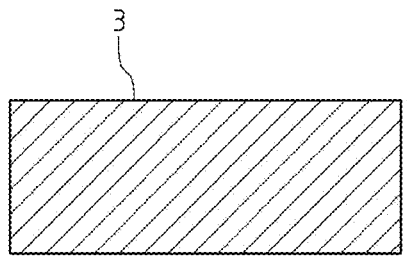
FIGS. 21A, 21B, 21C, 21D, 21E, 21F, and 21G depict views that illustrate a second embodiment of the method of manufacturing the thermoelectric power generation module according to the present disclosure.

As illustrated in FIG. 21A, a heat-dissipating body 3, which is cut into a thin plate shape having predetermined dimensions, is prepared. The heat-dissipating body 3 is, for example, a heat sink formed by cutting such a heat conductor as plate-shaped aluminum into predetermined dimensions. To improve heat dissipation, the heat sink may be provided with a heat dissipation fins (not illustrated) on a lower surface in the present figure.

Figure 21B:
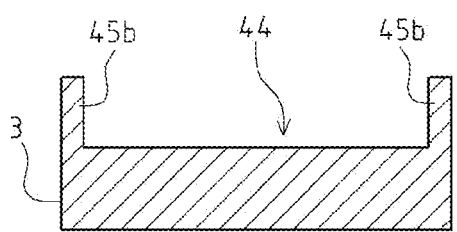

Next, as illustrated in FIG. 21B, a cavity 44 having a predetermined size and depth for disposing the thermoelectric power generation element 1 and the thermally-responsive body 4 is made in the top surface of the heat-dissipating body 3. Accordingly, a peripheral side surface of the formed cavity 44 configures a dividing wall 45b. Note that a dividing wall 45a (not illustrated) may be provided between the disposed thermoelectric power generation element 1 and thermally-responsive body 4. In addition, as in the first embodiment for a manufacturing method, a dividing wall 45c (refer to FIG. 20C) may be provided between the dividing wall 45a and the dividing wall 45b.

Figure 21C:
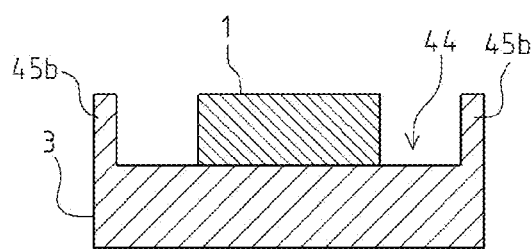

Next, as illustrated in FIG. 21C, the thermoelectric power generation element 1, which has an approximately rectangular shape and approximately the same thickness as that of the dividing wall 45b, is disposed at the approximately central section of the top surface of the heat-dissipating body 3. Alternatively, the thermoelectric power generation element 1, which has an approximately rectangular shape and has been made slightly thinner than the dividing wall 45b, is disposed at the approximately central section of the top surface of the heat-dissipating body 3. By setting the height of the thermoelectric power generation element 1 to be slightly lower than the height of the dividing wall 45b as with the latter case, when the thermally-responsive member 42 expands, it is possible to collect, at the peripheral section of the thermoelectric power generation module 100, residual air from the vacancy 43 formed at an upper section of the cavity 44.

Figure 21D:
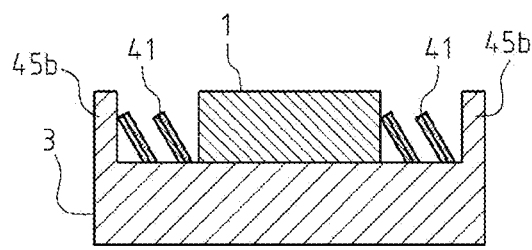

Next, as illustrated in FIG. 21D, heat conductors 41 for a thermally-responsive body 4 are disposed at an outer peripheral section of the thermoelectric power generation element 1 that is disposed at the approximately central section of the cavity 44. The thermally-responsive body 4 is not particularly limited to any of that in the first embodiment through the fourth embodiment. For example, it may be one of the first embodiment through the fourth embodiment, or may be something else.

Figure 21E:
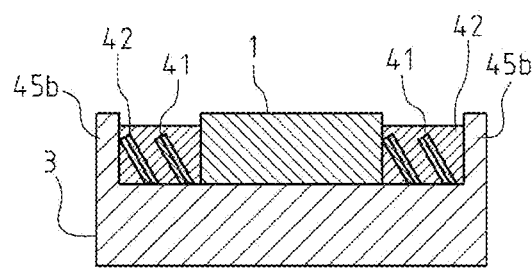

Next, as illustrated in FIG. 21E, a liquid thermally-responsive member 42 is poured into the cavity 44 formed at the outer peripheral section of the thermoelectric power generation element 1.

Figure 21F:
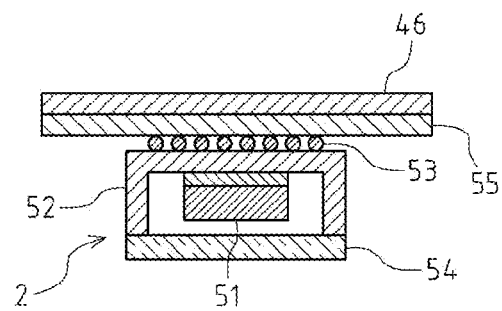
Figure 21G:
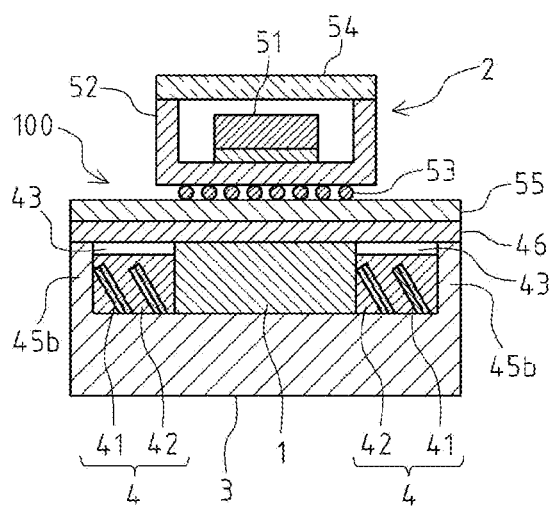

Next, as illustrated in FIG. 21G, the top surfaces of the thermoelectric power generation element 1 and the cavity 44 are covered by and adhered to a thermal interface material 46. As a result, the thermally-responsive body 4 is sealed. An adhesive having a high thermal conductivity is then applied to the top surface of the thermal interface material 46, and a heat-generating body 2 is adhered thereto.

The heat-generating body 2 is, for example, a semiconductor component having high power consumption, such as a CMOS image sensor, a microcomputer, or a power semiconductor. FIGS. 21F and 21G illustrate an example in which a CMOS image sensor which is a semiconductor component manufactured in a separate step is soldered to a substrate 55, the thermal interface material 46 is adhered thereto (FIG. 21F), this is caused to invert vertically and be adhered to the top surfaces of the thermoelectric power generation element 1 and the cavity 44. Because adhesion of the heat-generating body 2 is a final step, the heat-generating body 2 may be adhered to the thermal interface material 46 after covering and adhesion is performed with the thermal interface material 46. Alternatively, as illustrated in FIG. 21G, covering of and adhesion to the top surfaces of the thermoelectric power generation element 1 and the cavity 44 may be performed with something resulting from adhering the thermal interface material 46 to the heat-generating body 2.

By such steps as the above, it is possible to manufacture the thermoelectric power generation module 100.

7. Example of Application to Semiconductor Component

The technique as in the present disclosure can be applied to various products. For example, realization may be as a radiator that dissipates heat generated by a semiconductor component 5 which is, for example, a CMOS image sensor, a microcomputer, or a power semiconductor, and which is a heat-generating body 2, or as a thermoelectric power generation element 1 that uses this heat.

Figure 22:
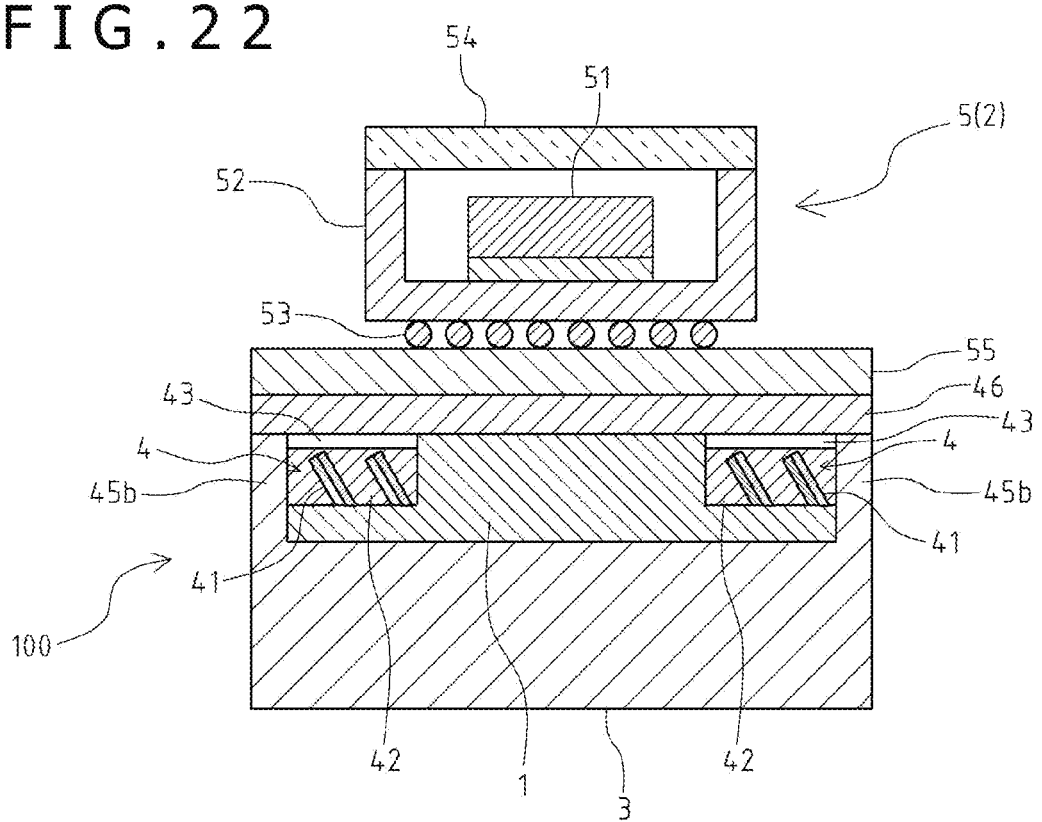
FIG. 22 is a side-surface cross-sectional view that illustrates an example of schematic configuration of a semiconductor component to which the present technique can be applied.

FIG. 22 is a side-surface cross-sectional view that illustrates an example of schematic configuration of the semiconductor component 5 to which a technique according to the present disclosure can be applied. For semiconductor component 5 in the same figure, a semiconductor chip 51 is adhered within a cavity in a package 52, and wire bonding, etc., is used to connect the semiconductor chip 51 to an external connection terminal 53. For example, in a case for a CMOS image sensor, a lid is put on the top surface of the package 52 with cover glass 54.

The semiconductor component 5 is soldered to the substrate 55. A glass epoxy resin or a ceramic is used for material for the substrate 55. A ceramic substrate is desirable from an aspect of heat dissipation. The thermoelectric power generation module 100 is adhered to a back surface of the substrate 55 via the thermal interface material 46. Leads 6 are let out from a positive electrode 13 and a negative electrode 15, which are not illustrated, for the thermoelectric power generation module 100 and connected to a load 7 (refer to FIG. 23). As a result, the thermoelectric power generation module 100 acts as a radiator for the semiconductor component 5 while also acting as a power supply for the load 7.

Note that description is given here regarding a radiator that dissipates heat generated by the semiconductor component 5 or the thermoelectric power generation element 1 that uses this heat, as an example, but there is no limitation to applying a technique according to the present disclosure to the semiconductor component 5, and application may be made to any other kind of heat source.

Finally, description of each embodiment described above is an example of the present disclosure, and the present disclosure is not limited to the embodiments described above. Accordingly, even in a case that is not any of the embodiments described above, it goes without saying that various changes according to design, etc., are possible if within a scope that does not deviate from a technical concept according to the present disclosure. In addition, effects described in the present specification are purely exemplary and are not limiting, and there may be other effects.

Note that the present technique can also have configurations as the following.

(1)
A thermoelectric power generation module including:
a heat-dissipating body that dissipates heat generated by a heat-generating body;
a thermoelectric power generation element disposed at an approximately central section of a top surface of the heat-dissipating body; and
a thermally-responsive body that is disposed on an outer peripheral section of the top surface of the heat-dissipating body and whose thermal resistance changes according to temperature, in which
the heat-generating body is disposed on top surfaces of the thermoelectric power generation element and the thermally-responsive body.

(2)
The thermoelectric power generation module according to the above (1), in which the thermally-responsive body is formed such that the thermal resistance of the thermally-responsive body becomes larger than a thermal resistance of the thermoelectric power generation element when the heat-generating body has a low temperature and that the thermal resistance of the thermally-responsive body becomes equal to or smaller than the thermal resistance of the thermoelectric power generation element when the heat-generating body has a high temperature.

(3)
The thermoelectric power generation module according to the above (2), in which
the thermally-responsive body has
a granular heat conductor disposed within a cavity provided at an outer peripheral section of the thermoelectric power generation element, and
a thermally-responsive member that has a high coefficient of linear expansion and is poured leaving a predetermined space within the cavity, and
the thermally-responsive member is configured to, when the heat-generating body has a low temperature, retain the predetermined space and, when the heat-generating body has a high temperature, expand and cause the predetermined space to shrink, reducing the thermal resistance of the thermally-responsive member by the heat-generating body being thermally connected to the heat-dissipating body via the heat conductor and the thermally-responsive member.

(4)
The thermoelectric power generation module according to the above (2), in which
the thermally-responsive body has
thin plate-shaped heat conductors stacked within a cavity provided at an outer peripheral section of the thermoelectric power generation element, and
a thermally-responsive member that has a high coefficient of linear expansion and is poured leaving a predetermined space within the cavity, and
the thermally-responsive member is configured to, when the heat-generating body has a low temperature, retain the predetermined space and, when the heat-generating body has a high temperature, expand and cause the predetermined space to shrink, reducing the thermal resistance of the thermally-responsive member by the heat-generating body being thermally connected to the heat-dissipating body via the heat conductor and the thermally-responsive member.

(5)
The thermoelectric power generation module according to the above (2), in which
the thermally-responsive body has
a heat conductor that includes a double layer structure having a high coefficient-of-linear-expansion material and a low coefficient-of-linear-expansion material that are disposed in an inclined manner within a cavity provided at an outer peripheral section of the thermoelectric power generation element, and
a thermally-responsive member that has a high coefficient of linear expansion and is poured leaving a predetermined space within the cavity, and
the thermally-responsive member is configured to, when the heat-generating body has a low temperature, retain a state in which disposition is in the inclined manner and, when the heat-generating body has a high temperature, expand such that the heat conductor bends and stands upright, changing the thermal resistance of the thermally-responsive member by the heat-generating body being thermally connected to the heat-dissipating body via the thermally-responsive member and the heat conductor that includes the double layer structure.

(6)

The thermoelectric power generation module according to the above (2), in which the thermoelectric power generation element having a protrusion is disposed within a cavity provided on the top surface of the heat-dissipating body, and the thermally-responsive body includes the granular heat conductor disposed within a space provided at an outer peripheral section of the protrusion, the thin plate-shaped heat conductor stacked within the space provided at the outer peripheral section of the protrusion, or a heat conductor that includes a double layer structure having the high coefficient-of-linear-expansion material and a low coefficient-of-linear-expansion material and is disposed in an inclined manner within the space provided at the outer peripheral section of the protrusion, and a thermally-responsive member that has a high coefficient of linear expansion and is poured leaving a predetermined space, and the thermally-responsive member and the heat conductor are configured such that, when the heat-generating body has a low temperature, the predetermined space or state is retained and, when the heat-generating body has a high temperature, the thermally-responsive member expands to cause the predetermined space to shrink or bend the heat conductor to have the heat conductor stand upright, changing the thermal resistance of the thermally-responsive member by the heat-generating body being thermally connected to the heat-dissipating body via the heat conductor and the thermally-responsive member.

(7)

The thermoelectric power generation module according to one of the above (3) to (6), in which the predetermined space is formed at an upper end of a peripheral side surface of the cavity provided at the outer peripheral section of the thermoelectric power generation element.

(8)

The thermoelectric power generation module according to one of the above (3) to (6), in which the thermoelectric power generation element disposed within the cavity is formed in an inclined shape having a predetermined thickness at an approximately central section of the top surface of the heat-dissipating body and becoming thinner from near the approximately central section toward a periphery of the outer peripheral section.

(9)

A method of manufacturing a thermoelectric power generation module, the method including:

a step of mounting the thermoelectric power generation element to a heat-dissipating body;

a step of disposing a member for surrounding the thermally-responsive body at an outer peripheral section of the thermoelectric power generation element mounted at the approximately central section;

a step of using the member for surrounding the thermally-responsive body disposed at the outer peripheral section, to mount the thermally-responsive body to a formed cavity;

a step of adhering a thermal interface material having high thermal conductivity, to top surfaces of the thermoelectric power generation element and the thermally-responsive body; and a step of adhering a heat-generating body to a top surface of the thermal interface material.

(10)

A method of manufacturing a thermoelectric power generation module, the method including:

a step of making, at an approximately central section of a heat-dissipating body, a cavity that has a predetermined depth and is for mounting the thermoelectric power generation element and the thermally-responsive body;

a step of mounting a thermoelectric power generation element into the cavity that has been made;

a step of mounting the thermally-responsive body in the cavity;

a step of adhering a thermal interface material having high thermal conductivity, to top surfaces of the thermoelectric power generation element and the thermally-responsive body; and a step of adhering a heat-generating body to a top surface of the thermal interface material.

REFERENCE SIGNS LIST

1: Thermoelectric power generation element
2: Heat-generating body
3: Heat-dissipating body
4: Thermally-responsive body
5: Semiconductor component
6: Lead
7: Load
11: p-type thermoelectric semiconductor
12: n-type thermoelectric semiconductor
13: Positive electrode
14: Conductor
15: Negative electrode
16: Hole
17: Electron
19: Inclined surface
31: Fin
41: Heat conductor
41a: High coefficient-of-linear-expansion material
41b: Low coefficient-of-linear-expansion material
42: Thermally-responsive member
43: Vacancy
43a: Air reservoir
44: Cavity
45a: Dividing wall
45b: Dividing wall
46: Thermal interface material
51: Semiconductor chip
52: Package
53: External connection terminal
54: Cover glass
55: Substrate
100: Thermoelectric power generation module

The invention claimed is:

1. A thermoelectric power generation module, comprising:

a heat-dissipating body configured to dissipate heat generated by a heat-generating body;

a thermoelectric power generation element at an approximately central section of a top surface of the heat-dissipating body; and a thermally-responsive body on an outer peripheral section of the top surface of the heat-dissipating body, wherein thermal resistance of the thermally-responsive body changes based on temperature, the thermal resistance of the thermally-responsive body becomes larger than a thermal resistance of the thermoelectric power generation element based on the heat-generating body that has a low temperature, the thermal resistance of the thermally-responsive body becomes equal to or smaller than the thermal resistance of the thermoelectric power generation element based on the heat-generating body that has a high temperature, the heat-generating body is on top surfaces of the thermoelectric power generation element and the thermally-responsive body, the thermally-responsive body includes:
a granular heat conductor within a cavity at an outer peripheral section of the thermoelectric power generation element, and
a thermally-responsive member that has a high coefficient of linear expansion, wherein a specific space is left within the cavity after the thermally-responsive member is poured in the cavity, and the thermally-responsive member is configured to:
retain the specific space based on the heat-generating body that has the low temperature; and
expand and cause the specific space to shrink based on the heat-generating body that has the high temperature, wherein
the thermal resistance of the thermally-responsive member is reduced based on the heat-generating body that is thermally connected to the heat-dissipating body via the granular heat conductor and the thermally-responsive member.

2. The thermoelectric power generation module according to claim 1, wherein the specific space is at an upper end of a peripheral side surface of the cavity provided at the outer peripheral section of the thermoelectric power generation element.

3. A thermoelectric power generation module, comprising:
a heat-dissipating body configured to dissipate heat generated by a heat-generating body;
a thermoelectric power generation element at an approximately central section of a top surface of the heat-dissipating body; and
a thermally-responsive body on an outer peripheral section of the top surface of the heat-dissipating body, wherein thermal resistance of the thermally-responsive body changes based on temperature, the thermal resistance of the thermally-responsive body becomes larger than a thermal resistance of the thermoelectric power generation element based on the heat-generating body that has a low temperature, the thermal resistance of the thermally-responsive body becomes equal to or smaller than the thermal resistance of the thermoelectric power generation element based on the heat-generating body that has a high temperature, the heat-generating body is on top surfaces of the thermoelectric power generation element and the thermally-responsive body, the thermally-responsive body includes:
thin plate-shaped heat conductors stacked within a cavity at an outer peripheral section of the thermoelectric power generation element, and
a thermally-responsive member that has a high coefficient of linear expansion, wherein a specific space is left within the cavity after the thermally-responsive member is poured in the cavity, and the thermally-responsive member is configured to:
based on the heat-generating body that has the low temperature, retain the specific space; and
based on the heat-generating body that has a high temperature, expand and cause the specific space to shrink, wherein
the thermal resistance of the thermally-responsive member is reduced based on the heat-generating body that is thermally connected to the heat-dissipating body via the thin plate-shaped heat conductors and the thermally-responsive member.

4. A thermoelectric power generation module, comprising:
a heat-dissipating body configured to dissipate heat generated by a heat-generating body;
a thermoelectric power generation element at an approximately central section of a top surface of the heat-dissipating body; and
a thermally-responsive body on an outer peripheral section of the top surface of the heat-dissipating body, wherein thermal resistance of the thermally-responsive body changes based on temperature, the thermal resistance of the thermally-responsive body becomes larger than a thermal resistance of the thermoelectric power generation element based on the heat-generating body that has a low temperature, the thermal resistance of the thermally-responsive body becomes equal to or smaller than the thermal resistance of the thermoelectric power generation element based on the heat-generating body that has a high temperature, the heat-generating body is on top surfaces of the thermoelectric power generation element and the thermally-responsive body, the thermally-responsive body includes:
a heat conductor within a cavity at an outer peripheral section of the thermoelectric power generation element, wherein
the heat conductor includes a double layer structure having a high coefficient-of-linear-expansion material and a low coefficient-of-linear-expansion material disposed in an inclined manner, and
a thermally-responsive member that has a high coefficient of linear expansion, wherein a specific space is left within the cavity after the thermally-responsive member is poured in the cavity, and the thermally-responsive member is configured to:
based on the heat-generating body that has the low temperature, retain a state in which disposition of the heat conductor is in the inclined manner; and based on the heat-generating body that has the high temperature, expand such that the heat conductor bends and stands upright, wherein the thermal resistance of the thermally-responsive member is changed based on the heat-generating body that is thermally connected to the heat-dissipating body via the thermally-responsive member and the heat conductor that includes the double layer structure.

5. The thermoelectric power generation module according to claim 4, wherein the thermoelectric power generation element within the cavity has an inclined shape, and the thermoelectric power generation element has a specific thickness at the approximately central section of the top surface of the heat-dissipating body and the thermoelectric power generation element becomes thinner from near the approximately central section toward a periphery of the outer peripheral section of the top surface of the heat-dissipating body.

6. A thermoelectric power generation module, comprising:

a heat-dissipating body configured to dissipate heat generated by a heat-generating body;

a thermoelectric power generation element at an approximately central section of a top surface of the heat-dissipating body, wherein the thermoelectric power generation element has a protrusion, and the thermoelectric power generation element is within a cavity on the top surface of the heat-dissipating body; and a thermally-responsive body on an outer peripheral section of the top surface of the heat-dissipating body, wherein thermal resistance of the thermally-responsive body changes based on temperature, the thermal resistance of the thermally-responsive body becomes larger than a thermal resistance of the thermoelectric power generation element based on the heat-generating body that has a low temperature, the thermal resistance of the thermally-responsive body becomes equal to or smaller than the thermal resistance of the thermoelectric power generation element based on the heat-generating body that has a high temperature, the heat-generating body is on top surfaces of the thermoelectric power generation element and the thermally-responsive body, the thermally-responsive body includes:

a heat conductor, wherein the heat conductor incudes one of a granular heat conductor within a space an outer peripheral section of the protrusion, a thin plate-shaped heat conductor stacked within the space at the outer peripheral section of the protrusion, or a double layered heat conductor disposed in an inclined manner within the space at the outer peripheral section of the protrusion, and the double layered heat conductor includes a double layer structure having a high coefficient-of-linear-expansion material and a low coefficient-of-linear-expansion material, a thermally-responsive member that has a high coefficient of linear expansion, wherein a specific space is left within the cavity after the thermally-responsive member is poured in the cavity, and the thermally-responsive member and the heat conductor are configured to:

based on the heat-generating body that has the low temperature, retain the specific space or a state of disposition of the heat conductor; and based on the heat-generating body that has the high temperature, expand the thermally-responsive member to cause the specific space to shrink or bend the double layered heat conductor to have the double layered heat conductor stand upright, wherein the thermal resistance of the thermally-responsive member is changed based on the heat-generating body that is thermally connected to the heat-dissipating body via the heat conductor and the thermally-responsive member.

* * * * *